(12) United States Patent
Caldwell et al.

(10) Patent No.: US 8,555,218 B2
(45) Date of Patent: *Oct. 8, 2013

(54) DECISION MODULES

(75) Inventors: Andrew Caldwell, Santa Clara, CA (US); Steven Teig, Menlo Park, CA (US)

(73) Assignee: Tabula, Inc., Santa Clara, CA (US)

(*) Notice: Subject to any disclaimer, the term of this patent is extended or adjusted under 35 U.S.C. 154(b) by 127 days.

This patent is subject to a terminal disclaimer.

(21) Appl. No.: 12/994,453

(22) PCT Filed: May 22, 2009

(86) PCT No.: PCT/US2009/045096
§ 371 (c)(1),
(2), (4) Date: Mar. 10, 2011

(87) PCT Pub. No.: WO2009/151934
PCT Pub. Date: Dec. 17, 2009

(65) Prior Publication Data
US 2011/0154279 A1 Jun. 23, 2011

Related U.S. Application Data

(60) Provisional application No. 61/055,983, filed on May 24, 2008.

(51) Int. Cl.
*G06F 17/50* (2006.01)
(52) U.S. Cl.
CPC .................................. *G06F 17/505* (2013.01)
USPC ........... 716/105; 716/103; 716/122; 716/123; 716/124; 716/130; 716/132
(58) Field of Classification Search
CPC .................................................. G06F 17/505
USPC ................ 716/103, 105, 122, 123, 124, 129, 716/130, 132
See application file for complete search history.

(56) References Cited

U.S. PATENT DOCUMENTS 5,208,768 A    5/1993  Simoudis
5,764,525 A *  6/1998  Mahmood et al. ............ 716/104
(Continued)

FOREIGN PATENT DOCUMENTS
WO     WO 2009/151934      12/2009

OTHER PUBLICATIONS

International Preliminary Report on Patentability for PCT/US2009/045096, Nov. 30, 2010 (issuance date), Tabula, Inc.

(Continued)

*Primary Examiner* — Phallaka Kik
(74) *Attorney, Agent, or Firm* — Adeli & Tollen LLP

(57) ABSTRACT

An abstract decision module primitive for placement within a logical representation (i.e., a netlist) of a circuit design is described. The decision module primitive receives as inputs alternative solutions for a given function or segment of a netlist. The alternative solutions include functionally equivalent, but structurally different implementations of the function or segment of the netlist. The decision module primitive alternatively selects between connecting one of the inputs to the netlist to provide a complete functional definition for the netlist based on constraint information. The selected input of the decision module may be updated as additional constraint information is determined throughout the various stages of the design process. In addition, alternative solutions for a given function or segment of the netlist may be added to and/or removed from the inputs of a decision module as additional constraint information is identified.

30 Claims, 24 Drawing Sheets

(56) References Cited

U.S. PATENT DOCUMENTS

| | | | |
|---|---|---|---|
| 6,430,730 B1* | 8/2002 | Ghatate et al. | 716/134 |
| 6,460,166 B1* | 10/2002 | Reddy et al. | 716/132 |
| 6,484,292 B1* | 11/2002 | Jain et al. | 716/104 |
| 6,711,729 B1 | 3/2004 | McElvain et al. | |
| 7,409,652 B1 | 8/2008 | Fox et al. | |
| 7,657,855 B1* | 2/2010 | Manaker et al. | 716/113 |
| 7,729,898 B1* | 6/2010 | Lytle | 703/26 |
| 7,779,380 B2 | 8/2010 | Honda | |
| 2006/0101359 A1* | 5/2006 | Horeth et al. | 716/5 |
| 2006/0271892 A1 | 11/2006 | Bohl et al. | |
| 2007/0016881 A1* | 1/2007 | Gregory et al. | 716/6 |
| 2007/0192752 A1* | 8/2007 | Bhattacharya et al. | 716/4 |
| 2008/0028347 A1* | 1/2008 | Hiraoglu et al. | 716/5 |
| 2008/0071514 A1 | 3/2008 | Yuri | |
| 2008/0216040 A1* | 9/2008 | Furnish et al. | 716/10 |
| 2009/0037863 A1* | 2/2009 | Breyer et al. | 716/11 |
| 2009/0254874 A1* | 10/2009 | Bose | 716/6 |
| 2010/0318954 A1* | 12/2010 | Yu et al. | 716/117 |
| 2011/0154278 A1* | 6/2011 | Caldwell et al. | 716/103 |

OTHER PUBLICATIONS

International Search Report for PCT/US2009/045096, Aug. 20, 2009 (mailing date), Tabula, Inc.

Written Opinion for PCT/US2009/045096, Aug. 20, 2009 (mailing date), Tabula, Inc.

Portions of prosecution history of U.S. Appl. No. 12/954,575, Apr. 22, 2013, Caldwell, Andrew, et al.

* cited by examiner

DECISION MODULES

CLAIM OF BENEFIT TO PRIOR APPLICATIONS

This application is a national stage application of PCT Application PCT/US2009/045096, entitled "Decision Modules," filed on May 22, 2009, now published as WO 2009/151934. PCT Application PCT/US2009/045096 claims the benefit of U.S. Provisional Patent Application Ser. No. 61/055,983, entitled "Decision Modules," filed May 24, 2008. U.S. Provisional Patent Application Ser. No. 61/055,983 and PCT Application PCT/US2009/045096, published as WO 2009/151934, are incorporated herein by reference.

FIELD OF THE INVENTION

The invention is directed towards integrated circuit (IC) design. Specifically, for an abstract primitive that retains an exponential number of alternative solutions for a particular segment or function of the IC design in a linear space.

BACKGROUND OF THE INVENTION

Synthesis tools are used to define an IC design and/or to map the design to a technology that is used to manufacture the IC. Such tools typically receive a design in one particular format and then perform a series of transformations on this format to define the design in another particular format. For instance, some synthesis tools receive the IC design in a register transfer language (RTL) format, and through a series of transformations, produce a circuit representation of the design that has been mapped to the technology used to manufacture the IC.

In performing the transformations, synthesis tools often must select between various available implementations for a given segment or function of the design. Typically, the synthesis tools make these decisions without sufficient data regarding constraints (e.g., timing data, area data, etc.) on the design. For example, a synthesizer might need to select a particular implementation of an adder. While different implementations of the adder may be functionally equivalent, the adders are not structurally equivalent. As such, each implementation is associated with different timing characteristics, area characteristics, etc. The synthesizer might need to select between the different adder implementations early in the synthesis flow. At the early stages, the synthesizer may not have sufficient constraint information (e.g., timing information about the expected signal delay or congestion information) to determine which of the viable options best satisfies the constraints. In such situations, synthesizers typically make greedy decisions that are not based on realistic data regarding design constraints.

Some synthesis tools today work in conjunction with placement tools during a multi-stage electronic design automation (EDA) process to improve the overall placement of the design. For instance, when a placer determines that a particular set of circuit modules in the design violates a particular design constraint, the placer will direct a synthesizer to provide an alternative implementation for the particular set of circuit modules to satisfy the particular design constraint. In response to such a request, the synthesizer might provide a better solution for the particular set of circuit modules that satisfies the particular design constraint. However, the new solution of the synthesizer might adversely affect the placement of other circuit modules causing the other circuit modules to violate one or more design constraints. This results in a cascading effect where a change in any one location of the design affects other circuits elsewhere within the design. As such, the prior art processes are prone to iteratively repeating until a preferred solution is determined that not only satisfies constraints for a particular implementation for a set of circuits, but that also satisfies constraints for other circuit modules affected by the placement of the particular selected implementation for the set of circuit modules. Such iterative repeating requires an exponential number of computations to converge to a solution that satisfies all constraints.

The cascading effect further causes a continual back and forth between the synthesis tool and other constraint analysis tools (e.g., a placement or routing engine). Every solution produced by the synthesis tool that does not satisfy the subsequent constraint analysis is returned to the synthesis tool with the constraint information in order for the synthesis tool to identify an alternative solution. The synthesis tool then determines an alternative solution and passes the alternative solution back to the constraint analysis tool for further constraint analysis. Such a back and forth between the synthesis tool and the constraint analysis tools is highly resource intensive (e.g., memory and/or processor) and time consuming.

Alternatively, some synthesis tools refrain from selecting between one of the viable options until the necessary information is available. To do so, each possible option is divided into a separate netlist before being passed to the constraint analysis tools. The constraint analysis tools then perform the constraint analysis on each option to determine which of the options is the preferred solution. Such an approach, while avoiding the continual back and forth between the synthesis tools and the constraint analysis tools, becomes infeasible for large scale designs where the netlist for every viable option consumes memory and the analysis of each netlist consumes processing resources of a computer system.

Therefore, there is a need in the art to leverage constraint data to select a preferred solution from amongst a set of viable solutions. However, since the constraint data may not be known until a later stage within the design process, there is a need to retain an exponential number of viable options across several stages of the design process using only a linear representation for the exponential number of options. Furthermore, selection of the preferred option should be allowed at any stage of the process without having to revert to previous stages within the EDA design process.

SUMMARY OF THE INVENTION

Some embodiments of the invention provide an abstract primitive "decision module" for insertion within a logical representation (i.e., a netlist) of a user circuit design. In some embodiments, the decision module receives as inputs alternative solutions for a given function or segment of a netlist. In some such embodiments, the alternative solutions include functionally equivalent, but structurally different implementations of the given function or segment of the netlist. The decision module selects one of the inputs to be connected to the remainder of the netlist to provide a complete functional definition for the netlist. The selection of a particular input may be based on design constraint information.

Some embodiments insert and retain the decision modules within the netlist as the netlist is transformed during a multi-stage EDA process. In some embodiments, the decision modules are retained within the netlist throughout the various synthesis stages of the EDA process. Specifically, decision modules are retained as a netlist initially specifying RTL operators is transformed into a circuit netlist, where the circuits have a direct realization to a particular technology. Accordingly, some embodiments insert and retain the decision modules from front-end non-Boolean synthesis stages (e.g., operator realization, data path reordering, memory mapping, etc.) to back-end Boolean synthesis stages (e.g., logic restructuring, resource sharing, Boolean satisfiability (SAT) sweeping, etc.). Boolean logic refers to a logical combinatorial system manipulating variables (such as computer logic elements), through the operators AND, OR, NOT, and XOR.

Each stage of synthesis provides constraint information that is used by some embodiments to (1) insert additional decision modules with multiple alternative solutions for a given function or segment of the netlist or (2) add, remove, or alter the solutions to previously inserted decision modules from earlier stages of synthesis. In this manner, preferred solutions for functions or segments of the netlist are identified from amongst an exponential number of possible alternatives through a linear representation of the exponential number of possible alternatives. Furthermore, some embodiments change the preferred solution by alternatively selecting between the possible alternatives prior to the passage of the netlist for placement as constraint information is identified throughout the synthesis flow.

Some embodiments further extend the use of decision modules beyond the various synthesis stages to facilitate post-synthesis operations of the EDA process such as placement, routing, and verification of the physical design. In some embodiments, the decision modules facilitate placement of the physical design by providing alternate post-synthesis solutions to the placer such that the placer is able to select between the different solutions in order to identify a solution that satisfies both synthesis and placement constraints. In some embodiments, the placer is provided with multiple different circuit module configurations that satisfy synthesis constraints. In some such embodiments, the placer then identifies a particular configuration that also satisfies placement constraints without having to revert back to the synthesis stage to derive the alternate configuration. In some such embodiments, the placer selects between alternate solutions for segments of various netlists in order to identify a combination of segments that satisfy placement constraints for the entire physical design.

In some embodiments, the decision modules facilitate routing of the physical design. The decision modules retain alternative post-synthesis (i.e., placement) solutions that are provided to a router such that the router is able to identify a particular combination of solutions that together satisfy routing constraints for the physical design without having to revert to the synthesis or placement stages when routing constraints cannot be satisfied.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

Figure 1:
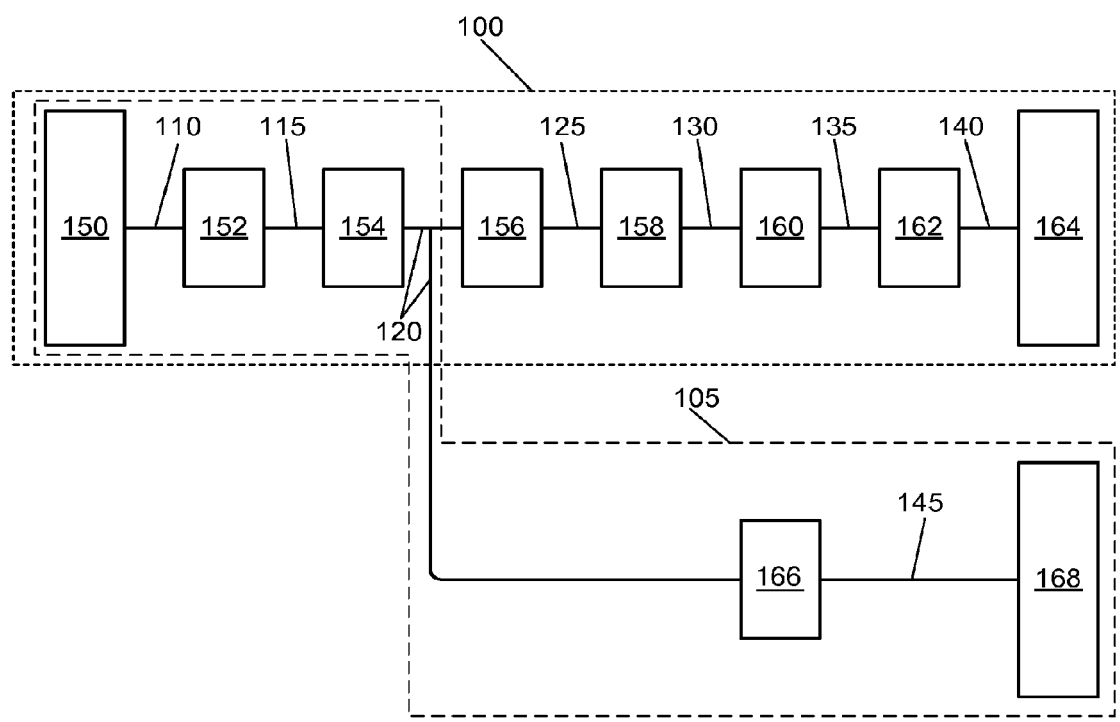
FIG. 1 illustrates a conceptual example of two netlists that are established by eight nets.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide an abstract primitive decision module for insertion within a logical representation (i.e., a netlist) of a user circuit design. In some embodiments, the decision module receives as inputs alternative solutions for a given function or segment of a netlist. In some such embodiments, the alternative solutions include functionally equivalent, but structurally different implementations of the given function or segment of the netlist. The decision module selects one of the inputs to be connected to the remainder of the netlist to provide a complete functional definition for the netlist. The selection of a particular input may be based on design constraint information.

Some embodiments insert and retain the decision modules within the netlist as the netlist is transformed during a multi-stage EDA process. In some embodiments, the decision modules are retained within the netlist throughout the various synthesis stages of the EDA process. Specifically, decision modules are retained as a netlist initially specifying RTL operators is transformed into a circuit netlist, where the circuits have a direct realization to a particular technology. Accordingly, some embodiments insert and retain the decision modules from front-end non-Boolean synthesis stages (e.g., operator realization, data path reordering, memory mapping, etc.) to back-end Boolean synthesis stages (e.g., logic restructuring, resource sharing, Boolean satisfiability (SAT) sweeping, etc.). Boolean logic refers to a logical combinatorial system manipulating variables (such as computer logic elements), through the operators AND, OR, NOT, and XOR.

Each stage of synthesis provides constraint information that is used by some embodiments to (1) insert additional decision modules with multiple alternative solutions for a given function or segment of the netlist or (2) add, remove, or alter the solutions to previously inserted decision modules from earlier stages of synthesis. In this manner, preferred solutions for functions or segments of the netlist are identified from amongst an exponential number of possible alternatives through a linear representation of the exponential number of possible alternatives. Furthermore, some embodiments change the preferred solution by alternatively selecting between the possible alternatives prior to the passage of the netlist for placement as constraint information is identified throughout the synthesis flow.

Some embodiments further extend the use of decision modules beyond the various synthesis stages to facilitate post-synthesis operations of the EDA process such as placement, routing, and verification of the physical design. In some embodiments, the decision modules facilitate placement of the physical design by providing alternate post-synthesis solutions to the placer such that the placer is able to select between the different solutions in order to identify a solution that satisfies both synthesis and placement constraints. In some embodiments, the placer is provided with multiple different circuit module configurations that satisfy synthesis constraints. In some such embodiments, the placer then identifies a particular configuration that also satisfies placement constraints without having to revert back to the synthesis stage to derive the alternate configuration. In some such embodiments, the placer selects between alternate solutions for segments of various netlists in order to identify a combination of segments that satisfy placement constraints for the entire physical design.

In some embodiments, the decision modules facilitate routing of the physical design. The decision modules retain alternative post-synthesis (i.e., placement) solutions that are provided to a router such that the router is able to identify a particular combination of solutions that together satisfy routing constraints for the physical design without having to revert to the synthesis or placement stages when routing constraints cannot be satisfied.

Several more detailed embodiments of the invention are described in the sections below. Before describing these embodiments further, Section I provides definitions for the various terms used to describe some embodiments of the invention. Next, Section II describes decision modules in accordance with some embodiments. That discussion is followed in Section III by a description of the application of the decision modules to the synthesis process. Next, Section IV describes the application of the decision modules to design placement. Section V then describes the overall manufacturing flow of some embodiments. Lastly, Section VI provides a description of a system architecture with which some embodiments of the invention are implemented.

I. Definitions

An integrated circuit (IC) is a device that includes numerous electronic components (e.g., transistors, resistors, capacitors, diodes, etc.) that are typically embedded on the same substrate, such as a single piece of semiconductor wafer. These components are connected with one or more layers of wiring to form multiple circuits, such as Boolean gates, memory cells, arithmetic units, controllers, decoders, etc. An IC is often packaged as one chip in a single IC package, although some IC packages can include multiple pieces of substrate or wafer.

A design layout is a geometric description of the circuit components included in an IC's design. An IC's design layout is often obtained by using a set of computer-based design automation tools to transform a code representation (e.g., an RTL representation) or circuit representation of the design into a geometric description. Electronic design automation (EDA) tools typically use different geometric objects with varying colors, fills, shapes and sizes to represent an IC's circuits, electronic components, and wiring.

In this document, the phrase "circuit module" refers to the circuit representation of an IC's electronic components or circuitry. Also, as used in this document, a netlist is a list of circuit modules and connections between them. For instance, FIG. 1 illustrates a conceptual example of two netlists 100 and 105 that are established by eight nets 110-145 that include one or more circuit modules. Seven nets 110-140 establish the netlist 100 through user register 150, components 152-162, and user register 164. Four nets 110-120 and 145 establish the netlist 105 through user register 150, components 152, 154, and 166, and user register 168. Aside from net 120, all nets are two terminal nets (i.e., connect two terminals). Net 120 is a three terminal net (i.e., connects three terminals).

A circuit representation of an IC design refers to all the circuit modules of the IC design and the connections between these modules. Accordingly, the modules at one stage of the design process represent abstract computation or sets of abstract computations (e.g., add, left shift, AND, etc.) within the netlist. At a later stage within the design process, the modules represent primitives within the fabric or instance in a technology library that correspond to physical components of an IC.

The design process entails various operations. Some conceptual representations for some of the various physical-design operations that EDA applications commonly perform to obtain the IC layouts include: (1) circuit partitioning, which partitions a circuit if the circuit is too large for a single chip; (2) floor planning, which finds the alignment and relative orientation of the circuit modules; (3) synthesis, which transforms an RTL or circuit representation to another circuit representation that is mapped to a particular technology of a particular IC; (4) layout, which generates the physical design (or layout) of the IC which includes placement and routing for defining the positions of the circuit modules and the interconnects between the circuit modules; and (5) verification, which checks the layout to ensure that it meets design and functional requirements. It should be apparent to one of ordinary skill in the art that in some embodiments the order in which the various EDA operations are performed need not adhere to the presentation order of the conceptual representations above.

II. Decision Cells

Some embodiments of the invention keep multiple viable choices for implementing a particular function or segment of an IC design by using "decision cells", which are placeholder representations of alternative designs. A particular decision cell is a placeholder design-modification representation for a particular part (function, portion, or section) of the IC design. For a particular IC-design part that produces a particular set of outputs from a particular set of inputs, the associated decision cell represents various different implementations that provide the same particular set of outputs from the same particular set of inputs. A decision cell (1) is a "decision module" in a circuit representation of an IC design, or (2) a "decision node" in a code representation of an IC design.

A decision module is a circuit module that can represent various different circuit implementations for a part of an IC design. In some embodiments, a decision module is an n-input, one-output primitive in the netlist. Each of the n-inputs may connect to a particular alternative circuit module, where each alternative circuit module provides the same functionality for a given set of inputs. Even though the n different circuit modules are functionally equivalent, they may have one or more different characteristics, such as different circuit structures, order for inputs, timing characteristics, delays, areas, etc. Additionally, the circuits that provide the inputs to the decision module may logically appear as a collection of neighboring circuit modules within the netlist. However, in some embodiments such circuits are physically interspersed throughout the IC. Furthermore, some such circuits include multiple output paths that connect to other circuits within the IC beside the decision module. As such, the decision module and its corresponding circuit modules do not delineate distinct regions within the IC or netlist.

Figure 2:
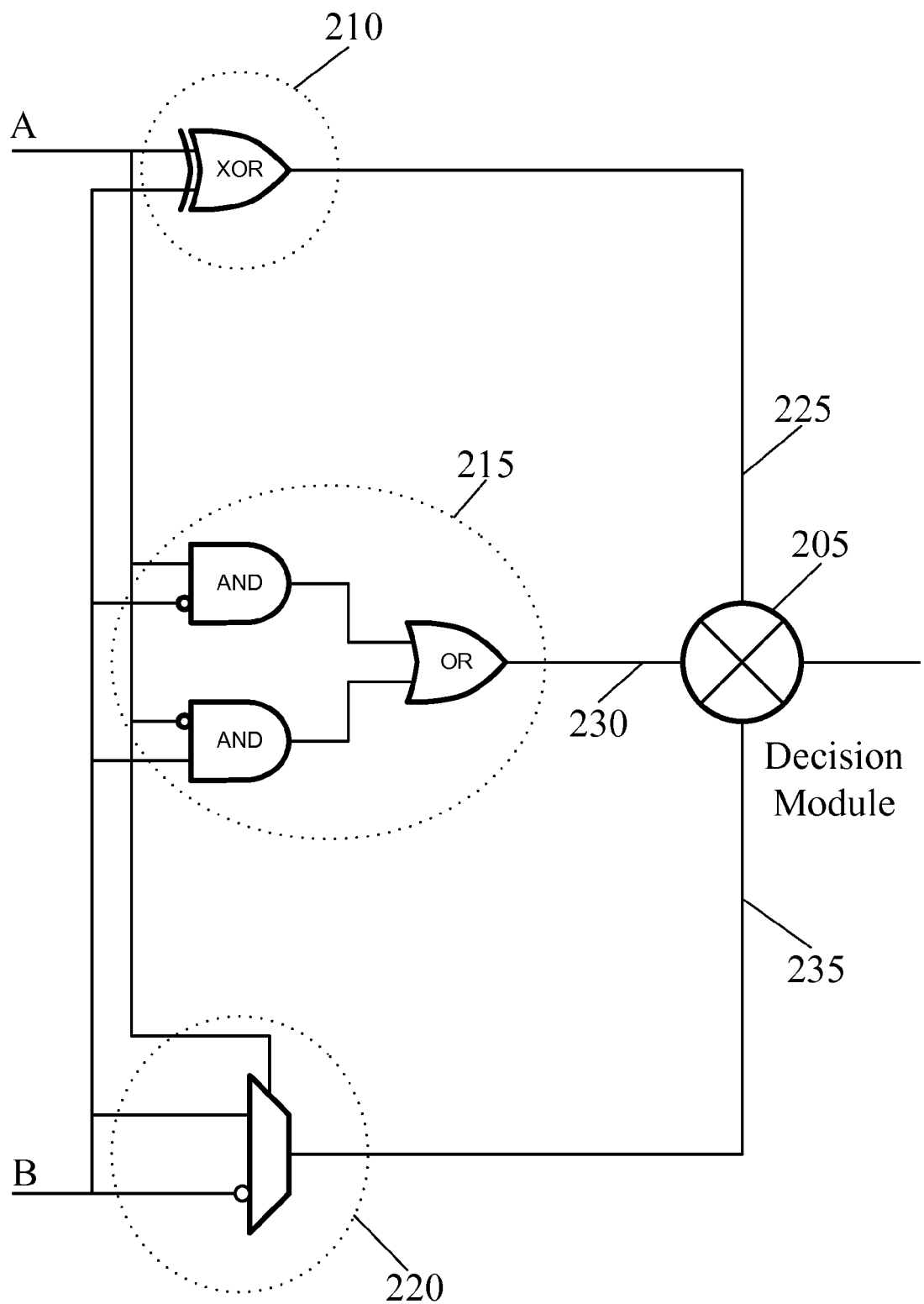
FIG. 2 illustrates an example of a decision module in accordance with some embodiments of the invention.

FIG. 2 illustrates an example of a decision module in accordance with some embodiments of the invention. Specifically, this Figure illustrates a decision module 205 that receives three alternatives at its inputs from three functionally equivalent circuits 210, 215, and 220. Each of the alternative circuits performs a Boolean XOR operation on two variables, A and B. The first input 225 is provided by an XOR gate 210 that receives the inputs A and B. The second input 230 is provided by a combination of two AND gates and an OR gate which together perform a functionally equivalent operation to the XOR gate 210. The third input 235 is provided by a multiplexer 220 that receives B and $\overline{B}$ on its inputs and receives A on its select line to perform a functionally equivalent operation to the XOR gate 210 and the combination of two AND gates and an OR gate of 215. In addition to connecting to the inputs 225-235 of the decision module 205, each of the alternative implementations 210-220 may also connect (i.e., fan out) to other circuit components in the netlist.

At any given time, some embodiments select one of the inputs of a decision module as the active input of the module (i.e., as the one input of the module that passes through to the module's output). This selected input is referred to as a "pick" of the decision module in some embodiments. The pick may change over time as additional constraint information identifies a better preferred pick or invalidates a currently selected pick from the set of decision module inputs. For instance, a currently selected pick that fails to satisfy identified timing constraints will be swapped for a different pick that better satisfies the identified timing constraints and/or other previously identified constraints (e.g., congestion, area, etc.). Also, the alternative circuits at the inputs to the decision module may change over time as the netlist progresses through the design process. At each stage of the design process, some embodiments identify new alternative picks thus increasing the available number of viable solutions for a particular function or segment of the netlist. Some embodiments invalidate previously viable picks thus decreasing the available number of viable solutions for a particular function or segment of the netlist.

In addition, some embodiments may allow for more than one decision cell solution to be fractionally selected at any given time so long as at the end of the synthesis stage, only one solution for each decision cell is selected. Specifically, some embodiments formulate the placement problem in terms of a linear programming problem that allows for different decision cell solutions to be afforded different selection rates or different fractional costs. At any given time, these fractional selection rates must sum to a value of one (e.g., one input to a decision cell may have a selection value of 0.7 while a second input has a selection value of 0.3). Some such embodiments allow the use of a linear programming solver to fully explore the decision space, while ultimately solving the synthesis problem to identify an implementation that has only one solution selected for each decision cell.

Figure 3:
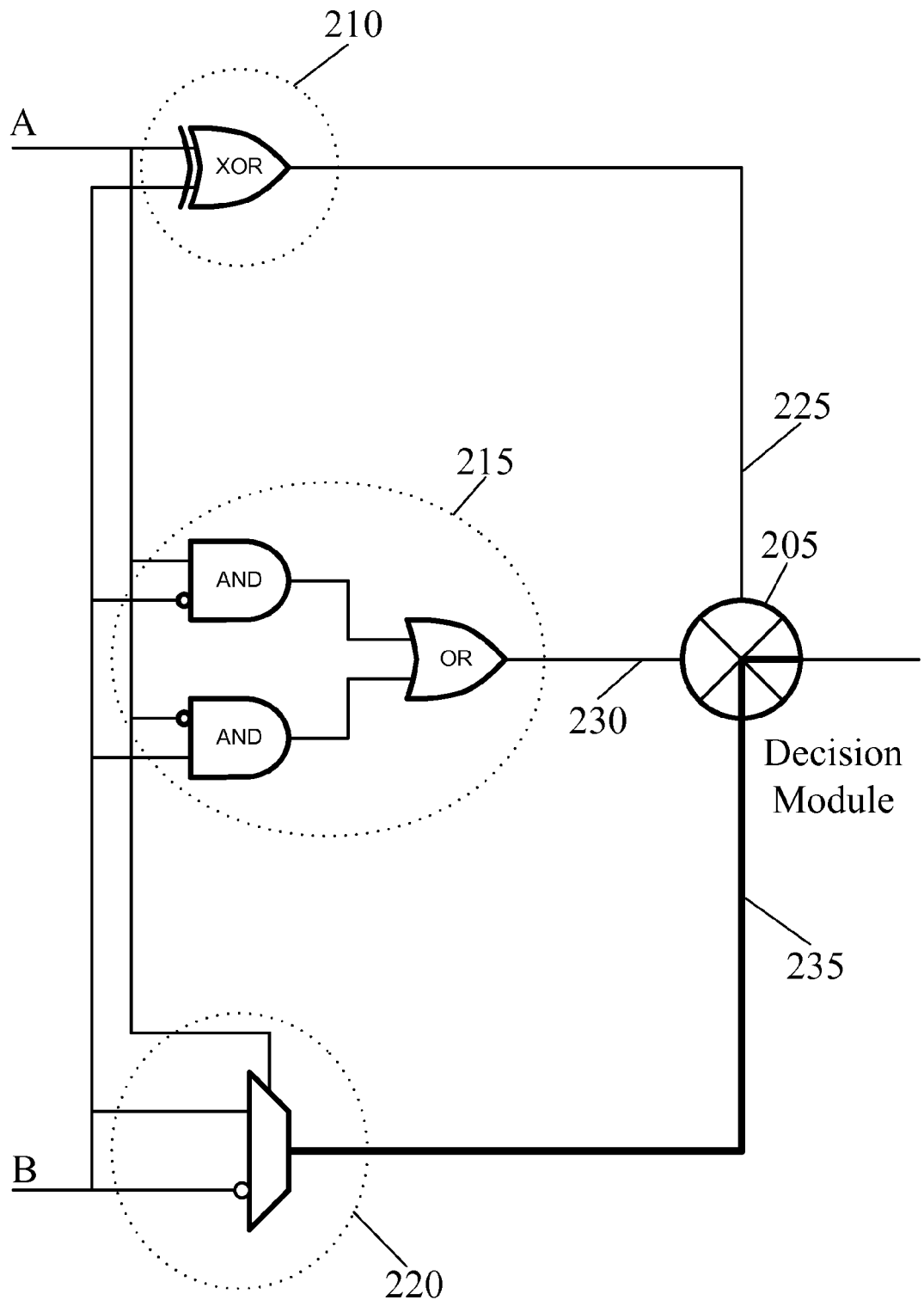
FIG. 3 conceptually illustrates a pick of a decision module of some embodiments showing a particular input being routed to an output of the decision module.

FIG. 3 conceptually illustrates the multiplexer 220 as the pick of the decision module 205, as it conceptually shows this input as being routed to the output of the decision module 205. With its pick identified, the decision module acts as a wire that connects its picked input to its output. The selection of a pick for each decision module in a netlist allows some embodiments to have a complete functional definition for a netlist at any given time, while still maintaining multiple solutions for particular circuit modules.

Figure 4:
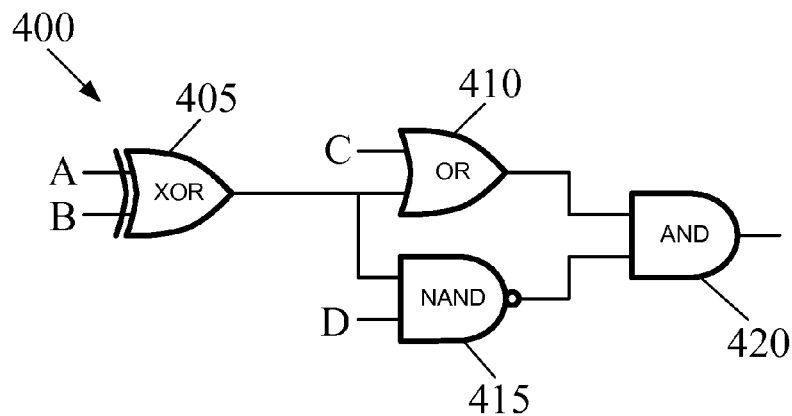
FIG. 4 illustrates a portion of a circuit that includes an XOR gate that receives two inputs A and B.
Figure 5:
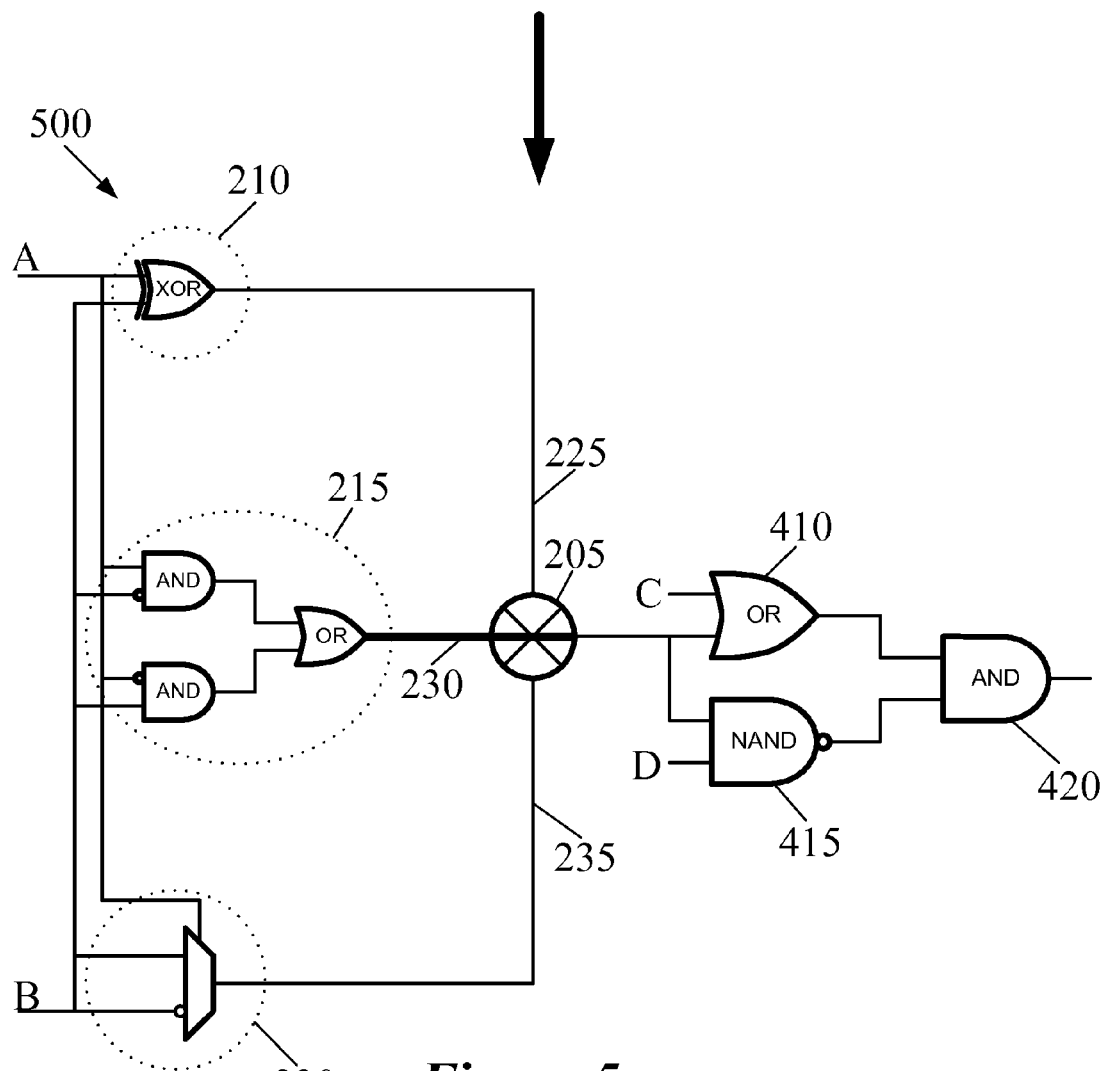
FIG. 5 illustrates the replacement of the XOR gate of FIG. 4 with a decision module of some embodiments.

FIGS. 4 and 5 conceptually illustrate an example of a macro-circuit 400 that includes a decision module and its alternative circuit modules. Specifically, FIG. 4 illustrates a portion of a circuit 400 that includes an XOR gate 405 that receives two inputs A and B. FIG. 5 illustrates the replacement of this XOR gate 405 in the macro-circuit 400 with the decision module 205. As mentioned above, this decision module 205 has three alternatives at its inputs, one 225 that comes from an XOR gate 210, one 230 that comes from combinational logic 215, and one 230 that comes from multiplexer 220.

The input 230 connected to the combinational logic 215 is the selected pick of the decision module 205 in this example. With this pick, the circuit 500 that is illustrated in FIG. 5 is as complete as the circuit 400 that is illustrated in FIG. 4. Specifically, with this pick, the circuit in FIG. 5 defines a complete path for each signal in the circuit like the circuit in FIG. 4. In addition to providing a complete circuit design, the circuit in FIG. 5 also provides alternative circuit implementations for performing the XOR operation that was previously performed by XOR gate 405 only.

The decision module 205 fans out into the same circuit modules as the replaced circuit module 405. Specifically, FIG. 5 illustrates the decision module 205 as fanning out into logic gates 410 and 415. This fan out is identical to the fan out of the XOR gate 405 that the decision module 205 replaced no matter which input is selected. The decision module 205 and the alternative circuit implementations 230 and 235 are thus transparently included within the netlist as the netlist remains functionally complete irrespective of the particular circuit implementation picked by the decision module.

In this manner, the netlist includes multiple different circuit implementations, each satisfying various design constraints differently. For example, a particular technology mapping that does not include XOR gates specifies a constraint that invalidates input 225 as a viable pick. In FIG. 4, no additional circuit implementations are provided and in such cases the design process would have to revert to a previous stage within the design process in order to identify an alternative implementation for the XOR gate before continuing. However, using the decision cell as illustrated in FIG. 5, some embodiments avoid the reversion to a previous stage by simply selecting an alternative circuit implementation that is already present within the netlist.

Figure 6:
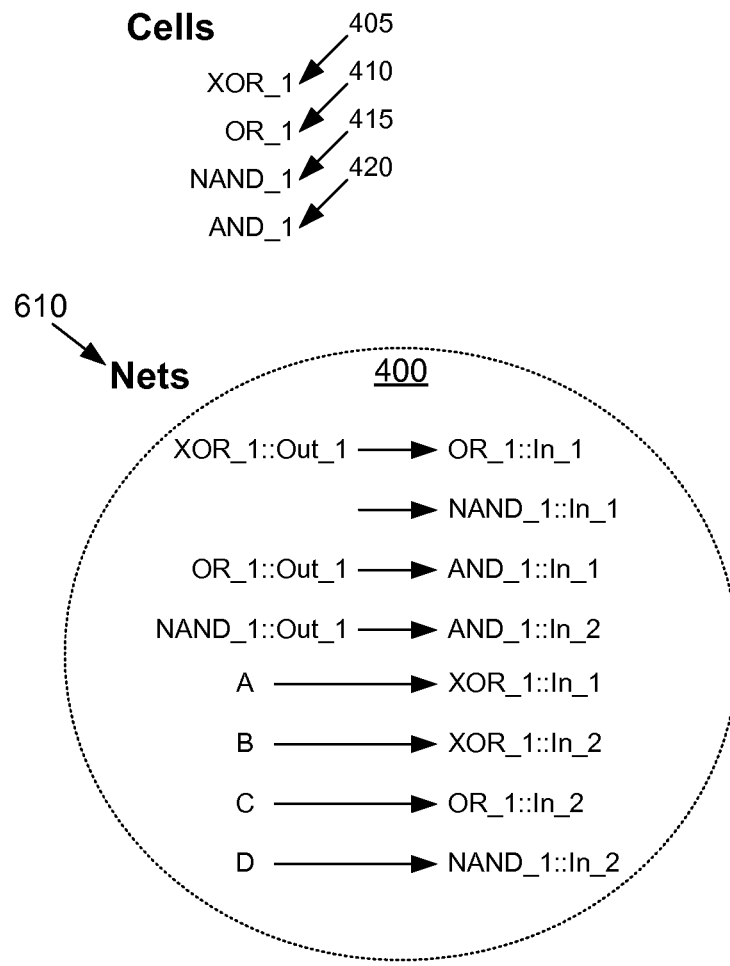
FIG. 6 provides an alternative netlist representation of some embodiments for the portion of the circuit of FIG. 4.
Figure 7:
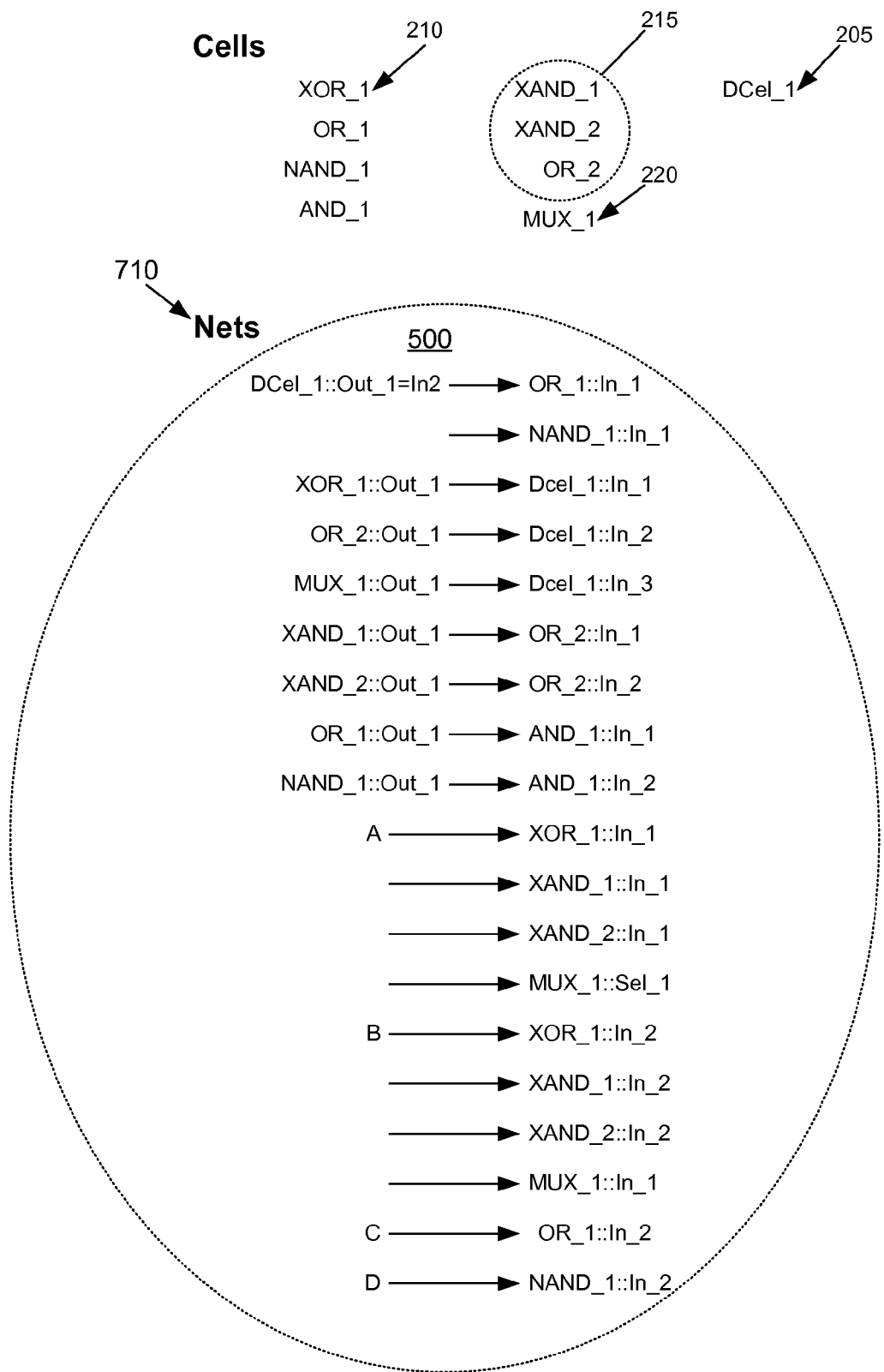
FIG. 7 illustrates the use of decision modules of some embodiments within an alternative netlist representation.

FIG. 6 provides an alternative netlist representation of some embodiments for the portion of the circuit 400 of FIG. 4. FIG. 7 provides an alternative netlist representation for the replacement of the XOR gate 405 with the decision module 205 as illustrated in FIG. 5. In FIG. 6, the gates 405-420 comprising the portion of the circuit 400 are represented textually using a set of cell monikers where each moniker corresponds to a particular logic gate of FIG. 4. The correspondence between the cells or the logical connection between the inputs and outputs of the cells is similarly represented textually via the netlist description 610 that builds the same circuit structure 400 as shown in FIG. 4 by textually linking an output of one cell to inputs of one or more other cells. For instance, the netlist description that specifies connecting the output of cell 405 to one of the inputs of cell 410 is as follows: XOR_1::Out_1→OR_1::In1.

FIG. 7 illustrates the use of decision modules within the alternative netlist representation. In this figure, the decision module 205 is represented using the cell moniker DCel_1. As shown within the netlist description 710, the decision cell moniker specifies three inputs In1, In2, and In3 each of which receive outputs from the alternative XOR implementations 210, 215, and 220. To specify the current pick for the decision cell moniker, the decision cell moniker includes an additional parameter that specifies which of the inputs is routed to the output. For example, DCel_1::Out1=In2 indicates that the second input from cells 215 is the current pick of the decision cell. It should be apparent to one of ordinary skill in the art that several different alternative representations are possible for representing the same portion of a design.

Such multiple representations are used by some embodiments as the design undergoes various synthesis operations. In some embodiments, the transformation includes converting a high level visual description such as that of FIGS. 4 and 5 to the lower level and more detailed textual descriptions such as that of FIGS. 6 and 7. Transformations may also occur when some embodiments convert an initially non-Boolean description of the design to a Boolean description by performing technology mapping on a design.

During any such transformation, some embodiments retain the decision cells and the associated alternative implementations within the netlist or design irrespective of the transformation taking place. Therefore, when a design is converted from a non-Boolean representation to a Boolean representation, the decision module within the non-Boolean representation is retained within the Boolean representation even though the structures of the alternative implementations associated with the decision module have been converted from their non-Boolean representation to a corresponding Boolean representation. Such transformations often occur during the various stages of a design process such as synthesis. Some various synthesis transformations are described below in Section III in further detail.

The decision modules of some embodiments are therefore capable of representing an arbitrary number of alternative solutions for a given function or segment of a netlist. Moreover, by using the decision modules, the above described method linearly represents an exponential number of different netlists specifying the alternative solutions. Specifically, assume that an IC design includes N decision modules, each with M choices. Such a design represents $M^N$ different netlists, however only N*M circuit variations need to be stored, instead of $M^N$ circuit variations.

Accordingly, the decision modules allow a large, exponential number of solutions to be represented in a small, linear amount of space. Selecting between the different picks occurs using less memory and fewer processing resources than would otherwise be needed if each possible alternative was enumerated as a separate netlist or if every possible alternative required the design process to regress to an earlier stage of the process in order to specify an alternative circuit implementation to replace a previous circuit implementation.

In some embodiments, the decision modules are passed between different stages of the design process. These different stages may be used to transform the design and corresponding netlists from a high level (i.e., RTL) to a low level. The transformed low level design and corresponding netlists specify placeable technology-specific circuits. This permits the same decision modules to simultaneously apply to non-Boolean front-end synthesis operations and Boolean specific back-end synthesis operations that transform the design and corresponding netlists from the high level to the low level. This further permits some embodiments to delay the selection of a preferred solution or alternate between the various alternatives until multiple constraints for multiple different stages of the synthesis flow are satisfied.

Decision modules remain within the netlist until placement of the design. Prior to placement, only the selected (i.e., "picked") solutions and other necessary data are passed to the placer in some embodiments. The decision modules are abstract primitives within the netlist and do not represent actual physical circuits that need placing. Similarly, the alternative unselected solutions include superfluous circuit implementations that do not actually get placed and therefore are not passed to the placer. In other embodiments, the decision modules are retained in the design during placement (and/or routing) of the design. Such embodiments will be described in more detail in Section IV, below.

Although decision cells have been described with reference to certain features and properties, one of ordinary skill in the art will recognize that decision cells may be implemented in various different ways without departing from the spirit of the invention. For instance, in some embodiments, a decision cell may include more than one output.

III. Synthesis

As stated above, decision modules can be used to keep some or all viable choices until better data is available in the design process to prune or select one of the choices. A viable option need not be an optimal solution for a particular functionality of the netlist, but rather one that satisfies a known set of design constraints (e.g., delay, area, congestion, etc.) at a particular stage of the design process.

As the design process proceeds, different design constraints are imposed on the design causing the set of viable options to change. By retaining the decision modules throughout the synthesis flow, some embodiments modify a current pick to select a different option that better satisfies newly identified constraints. Similarly, some embodiments remove certain options that no longer satisfy the design constraints as new constraints are identified and/or add new options to satisfy newly identified constraints. In this manner, some embodiments ensure that the selected preferred solution satisfies all previous stages of the synthesis flow.

For instance, some embodiments are able to identify timing constraints associated with various alternative solutions during non-Boolean stages of the design process, but are unable to identify area constraints associated with the various alternative solutions until subsequent Boolean stages of the design process. Specifically, some alternative implementations for a decision module that selects between different adders include ripple carry adders, carry look-ahead adders, and a carry save adder. Timing constraint data for each such adder is typically available during the non-Boolean stages of the design process. For example, a ripple carry adder is slower than a carry look-ahead adder since the ripple carry adder must wait for a carry bit to propagate from the least significant bit of the ripple carry adder. However, area constraint data for the adders will not be known until the Boolean stages of the design process where technology specific circuit implementations for each of the adders are provided. By retaining the decision modules throughout the synthesis flow, some embodiments are able to account for all such constraints when selecting between the various adder implementations.

Synthesis is one stage in the design process in which decision modules can be used to keep multiple viable choices while transforming (e.g., defining, modifying, replacing, etc.) sections of the design. Sub-section A below provides a conceptual overview of the use of decision modules for a transformation operation that is performed during synthesis. Sub-section B then provides a conceptual flow of a part of a synthesis process of some embodiments. Sub-section C next provides various examples of the application of decision modules during different non-Boolean and Boolean stages of the synthesis flow.

A. Overview

Some embodiments provide a synthesis method for defining an IC design. The method initially receives a first representation of an IC design. The first representation of the IC design has several parts as described below. The method then iteratively performs transformations on the parts of the design to produce a second representation of the design. The second representation may include several decision modules. At least one decision module includes or represents several equivalent implementations or realizations for a particular portion of the design as defined by the first representation.

In some embodiments, the first representation is a hardware description language (HDL) representation of the design (e.g., an RTL representation) and therefore may include technology independent representations for the elements of the design. In some embodiments, the second representation is a circuit representation. In other embodiments, both representations are circuit representations of the design. In yet other embodiments, both representations are HDL representations of the design. The first representation does not include any decision modules in some embodiments, while it includes such modules in other embodiments. Additionally, in some embodiments, the first representation defines a netlist of the design and the second representation defines a netlist that includes modifications to the first representation netlist.

The synthesis method of some embodiments performs pruning operations during or after the iterative transformations. These pruning operations eliminate one or more of the alternative implementations of some of the decision modules based on additional data that becomes available during or after the iterative transformations.

The synthesis method of some embodiments can perform the iterative transformations that result in the addition or pruning of decision modules during various stages of circuit synthesis. Examples of such stages include data reordering operations, resource sharing operations, operator realization operations, memory mapping operations, logic restructuring operations, etc. It should be apparent to one of ordinary skill in the art that even though the synthesis method of some embodiments has been described with first and second representations, some embodiments produce multiple additional representations. For instance, after each iterative transformation of the synthesis method, some embodiments produce a modified representation such that new decision modules are added into the modified representation, alternative options are added to or removed from the modified representation, different options (i.e., "picks") are selected for various decision modules of a previous representation, and/or components of a previous representation are modified such that a high level representation (e.g., RTL) is transformed into a low level representation (i.e., a technology specific circuit implementation).

B. Overall Flow

Figure 8:
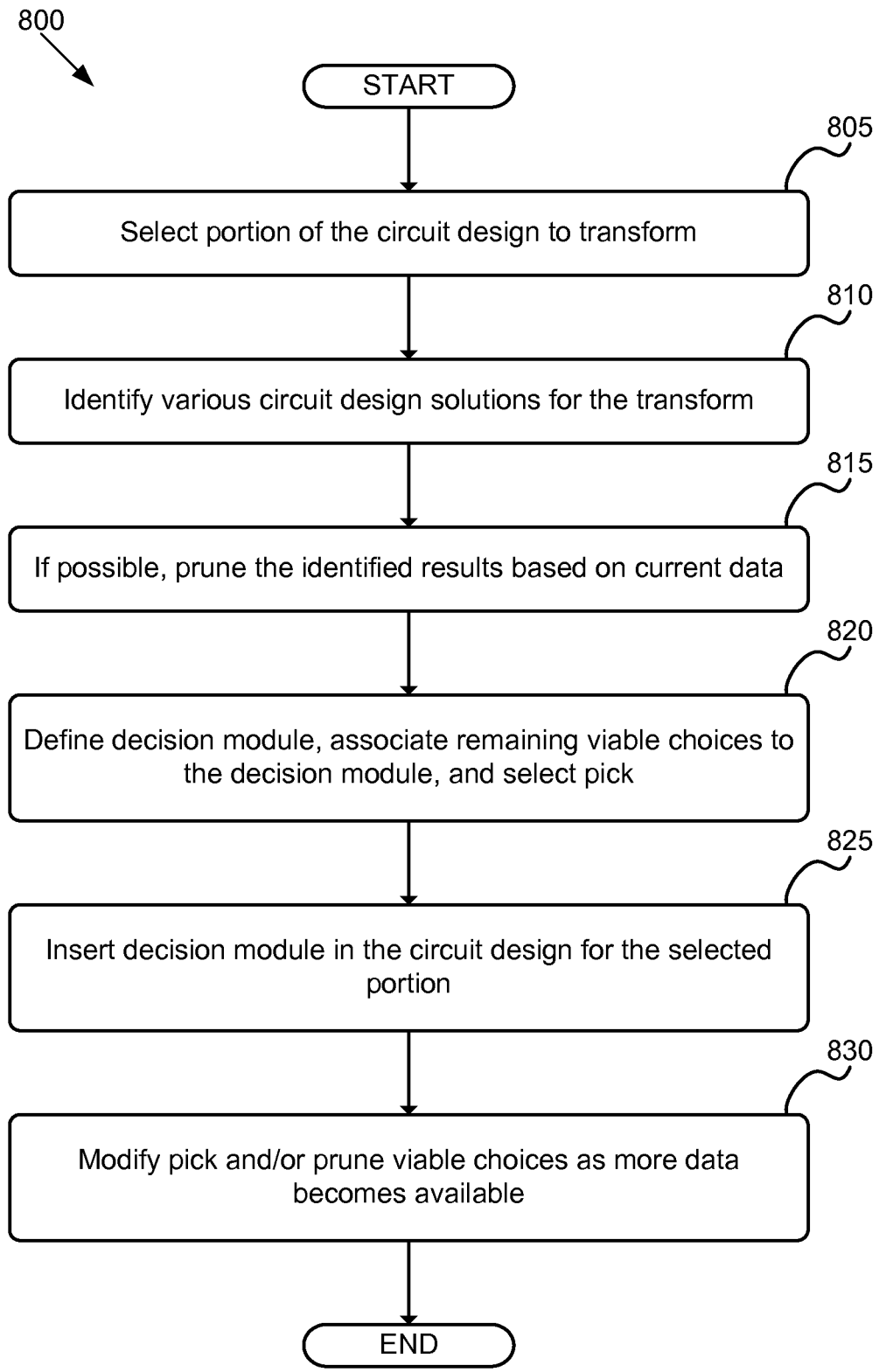
FIG. 8 conceptually illustrates a process that some embodiments perform during synthesis to transform a portion (also called section or part) of a circuit design.

FIG. 8 conceptually illustrates a process 800 that some embodiments perform during synthesis to transform a portion (also called a section or part) of a circuit design. As shown in this figure, the process 800 initially selects (at 805) a portion of the circuit design to transform. In some embodiments, the process performs this selection on a circuit representation of the circuit design. In some of these embodiments, the selected portion is a circuit module in the circuit design or a circuit module within a netlist of the circuit design which the process 800 selects randomly or selects by stepping through the circuit modules according to a particular order. The selected portion in other embodiments, however, might be a combination of several different individually selectable circuit modules in the design.

After selecting (at 805) the portion to transform, the process 800 identifies (at 810) various circuit design solutions for the transform. In some embodiments, each circuit module in the circuit design has a handle that defines its function (e.g., specifies that it is an adder, a subtractor, a particular Boolean gate, etc.). To identify the viable replacements for a circuit module selected at 805, the process in some embodiments uses (at 810) the selected circuit module's handle to identify its function. The process then uses this identified function to retrieve from a library or other kind of storage structure one or more alternative implementations that perform the same identified function based on the same inputs using a different structure.

For instance, the process 800 might select (at 805) the XOR 405 of FIG. 4 as the selected portion of the circuit design. The process might then identify (at 810) the alternative XOR function implementations 215 and 220 as equivalent implementations of the XOR 405. Additionally, in some embodiments the steps 805 and 810 apply to non-Boolean stages of the design process. For instance, the process 800 might select (at 805) a particular mapping of memory modules to define a memory of the design and then identify (at 810) alternative mappings for the memory modules to alternatively define the memory of the design.

After 810, the process 800 performs (at 815) an initial pruning operation to try to eliminate some of the solutions identified at 810. This initial pruning operation is based on constraint data that the process has at the time that it identifies the potential solutions at 810. Additional constraint data may become available later in the synthesis flow.

Hence, when the transformation process 800 is performed for a selected circuit module early in the synthesis flow, less data is available to prune the potential solutions. Nonetheless, this data might be sufficient to prune (i.e., eliminate) one or more of the potential solutions identified at 810. For instance, a selected choice with too long a delay or too large an area to be tolerated will be removed from the set of viable alternatives.

To perform the pruning operations, some embodiments compute a metric score that quantifiably represents the effectiveness of the particular choice in satisfying one or more constraints. In some embodiments, different constraints are factored more heavily than others in the computation of the metric score. In this manner, certain critical constraints (e.g., timing) that must be met are given precedence over other optimization constraints (e.g., size). Those choices with the lowest metric scores either do not satisfy the set of constraints or only minimally do so. Through comparison to a threshold metric value or through a relative comparison between the alternatives, some choices may be pruned from the set of viable choices. After the initial pruning operation at 815, the other remaining solutions may get pruned later in the synthesis flow as more constraint data become available and/or as the alternative solutions progress from high level non-Boolean implementations to lower level Boolean specific or technology specific implementations. Each level of progression within the synthesis flow provides additional information for narrowing the number of alternative solutions in order to reach the preferred solution. This additional pruning will be further described below.

The process defines (at 820) a decision module to retain the viable alternative solutions. The process associates (e.g., links) this decision module with the solutions remaining after the initial pruning operation at 815 (i.e., with the solutions that were identified at 810 and that were not eliminated at 815). The remaining solutions might include the circuit module selected at 805. At 820, the process also selects one of the solutions as the pick of the decision module, thus keeping the circuit design or netlist including the selected portion functionally complete while making the insertion of the decision module transparent to the rest of the circuit design or netlist. For example, the process at 820 might (1) generate the decision module 205 of FIG. 5, (2) associate the circuit modules 215 and 220 and the XOR 210 with this decision module 205, and (3) select the output of the circuit module set 215 as the pick of the decision module 205. After 820, the process inserts (at 825) the decision module and the associated viable alternative solutions into the circuit design or netlist in place of the portion selected at 805.

After inserting the decision module in the circuit design or netlist, the process selectively modifies (at 830) the pick and/or prunes the solutions associated with the decision module as the synthesis flow progresses and more constraint data becomes available. The additional constraint data further permits the process to better select among the alternative solutions of the decision module. In some embodiments, this later modification/pruning operation 830 is performed by a process or processes different than the process or processes that perform the operations 805-825. However, the modification/pruning operation 830 is illustrated in FIG. 8 in order to convey that after the insertion of a decision module, its pick might be modified and/or its solutions might be pruned as more constraint data is obtained during the subsequent stages of the synthesis process.

In some embodiments, the pruning criteria include manufacturing technology dependent pruning factors and manufacturing technology independent pruning factors. Examples of manufacturing technology dependent pruning factors include area, timing delay, etc. Examples of technology independent pruning factors include weighted depths of logic functions, number of binary decision nodes, etc.

It should be apparent to one of ordinary skill in the art that as the synthesis flow progresses, the decision module is retained within the netlist even though the implementations for the selected pick and the alternative solutions of the decision module may change depending on the stage within the synthesis flow. For instance, at a first stage of the synthesis flow, a decision module may be inserted into a netlist to select between multiple different non-Boolean adder implementations. At a second stage of the synthesis flow, the decision module may be retained within the netlist, however each of the adder implementations specify Boolean logic tied to a particular technology mapping.

C. Examples of Using Decision Modules in the Synthesis Flow

Figure 9:
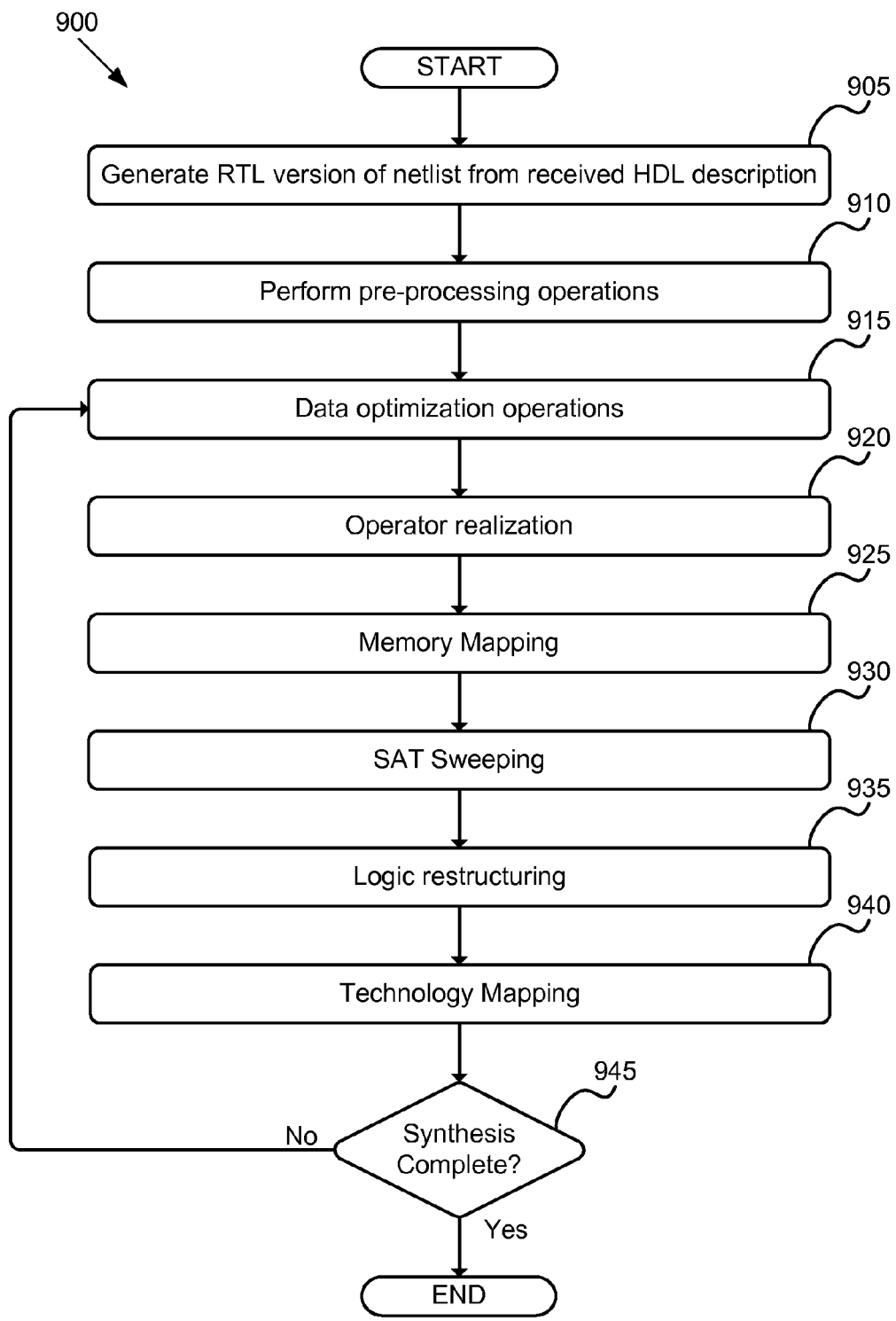
FIG. 9 presents a conceptual illustration of the synthesis process of some embodiments of the invention.

To provide more examples of how decision modules can be used at different stages of a synthesis process, FIG. 9 presents a conceptual illustration of the synthesis process 900 of some embodiments of the invention. The synthesis process 900 generates an RTL netlist from an HDL description and transforms the netlist from RTL operators into circuit modules that have a direct realization on the logic and routing resources of a configurable IC that is based on a particular manufacturing technology (e.g., 90 nm technology).

This process performs a series of transformations and mappings and uses decision modules whenever possible to maintain more than one viable option. The synthesis process constantly tries to prune equivalent options from the decision modules. To perform the pruning, the synthesis process obtains, at different stages of its operation, additional constraint data that identifies some of the equivalent alternatives of the decision modules as violating one or more criteria (such as area limits, timing criteria, etc.).

As shown in FIG. 9, the process 900 initially converts (at 905) a received HDL description for a design into an RTL description. Many tools are available for performing this conversion. Next, the process performs (at 910) pre-processing operations to clean up the design. Examples of such pre-processing operations include constant propagation, dead code removal, etc.

The process 900 then performs front-end synthesis operations such as data path optimization (at 915) on some or all of the RTL operators specified in the design. In some embodiments, data path optimization includes data path re-ordering and resource sharing operations. These operations can employ decision modules in order to maintain multiple viable choices for different transformations to the circuit design. The process 900 may also introduce decision modules when performing (at 920) operator realization to determine a particular implementation of an operator, when performing (at 925) memory mapping to map logically assigned memories to physical hardware, when performing (at 930) SAT sweeping to remove redundancies from the design, similarly when performing (at 935) logic restructuring to remove redundancies from the design, and when performing (at 940) other back-end synthesis operations such as technology mapping to map the circuit modules to a particular technology.

Some of the front-end operations are non-Boolean operations such that physical implementation limitations of a particular technology do not constrain the implementation. These front-end non-Boolean operations include operator realization and memory mapping, as some examples. Other front-end operations may include Boolean dependent operations such as SAT Sweeping and logic restructuring operations as some examples. Several examples illustrating the application of decision modules with reference to these various stages of synthesis are enumerated below.

The process then determines (at 945) whether further portions of the design have to undergo synthesis or whether additional iterations are needed to fully synthesize the design. If additional synthesis is required, the synthesis flow is repeated by performing some or all of steps 915-940. Otherwise, the process terminates.

In some embodiments, the process 900 includes additional operations performed in conjunction with or instead of some the above enumerated operations at steps 915-940. For instance, in some embodiments, state machine encoding is part of the process 900 and decision cells can be used to retain different viable state machine options throughout the process. Furthermore, FIG. 9 illustrates a particular ordering for performing front-end synthesis operations prior to back-end operations. However, in some embodiments, the operations are performed selectively or the classification for defining front-end and back-end operations changes. In this manner, some embodiments classify SAT sweeping as a front-end synthesis operation that is performed prior to performing (at 920) operator realization.

1. Data Path Re-ordering

Figure 10:
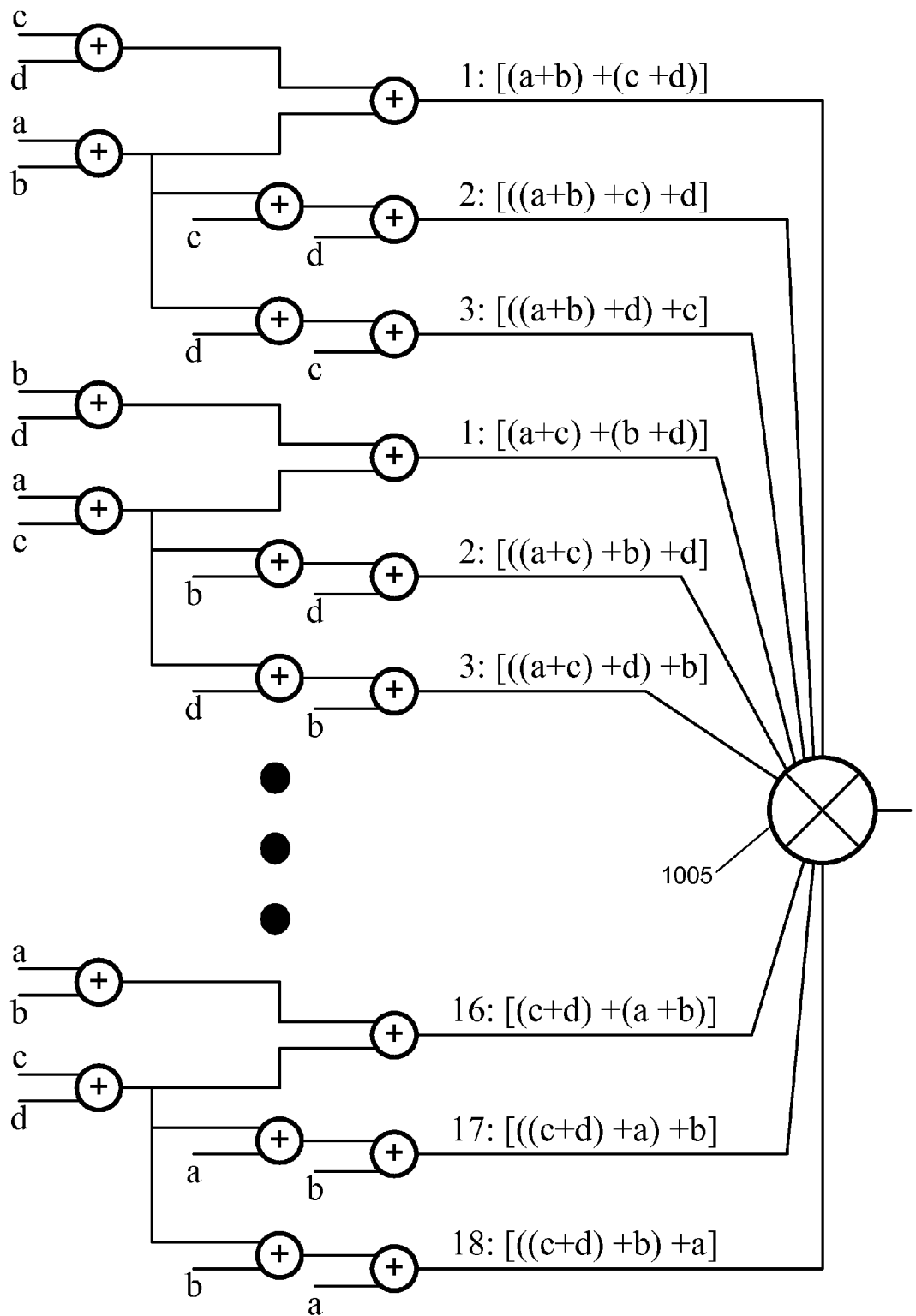
FIG. 10 illustrates various alternative formulations for a segment of a netlist and the association of these formulations with a decision cell in accordance with some embodiments of the invention.

A data path re-ordering operation may utilize associative or commutative laws to identify different orderings for the variables or operators of a particular operation. These different orderings allow for the execution of the particular operation using different configurations that may satisfy various design constraints. By way of example, one or more RTL operators might perform the operation H=(a+b)+(c+d). This operation can be implemented by permuting the variables in one of eighteen different ways. Each way can be formulated and then associated with a decision module to replace the RTL operator(s) that previously performed the calculation. FIG. 10 illustrates these formulations and the association of these formulations with a decision cell 1005.

Figure 11:
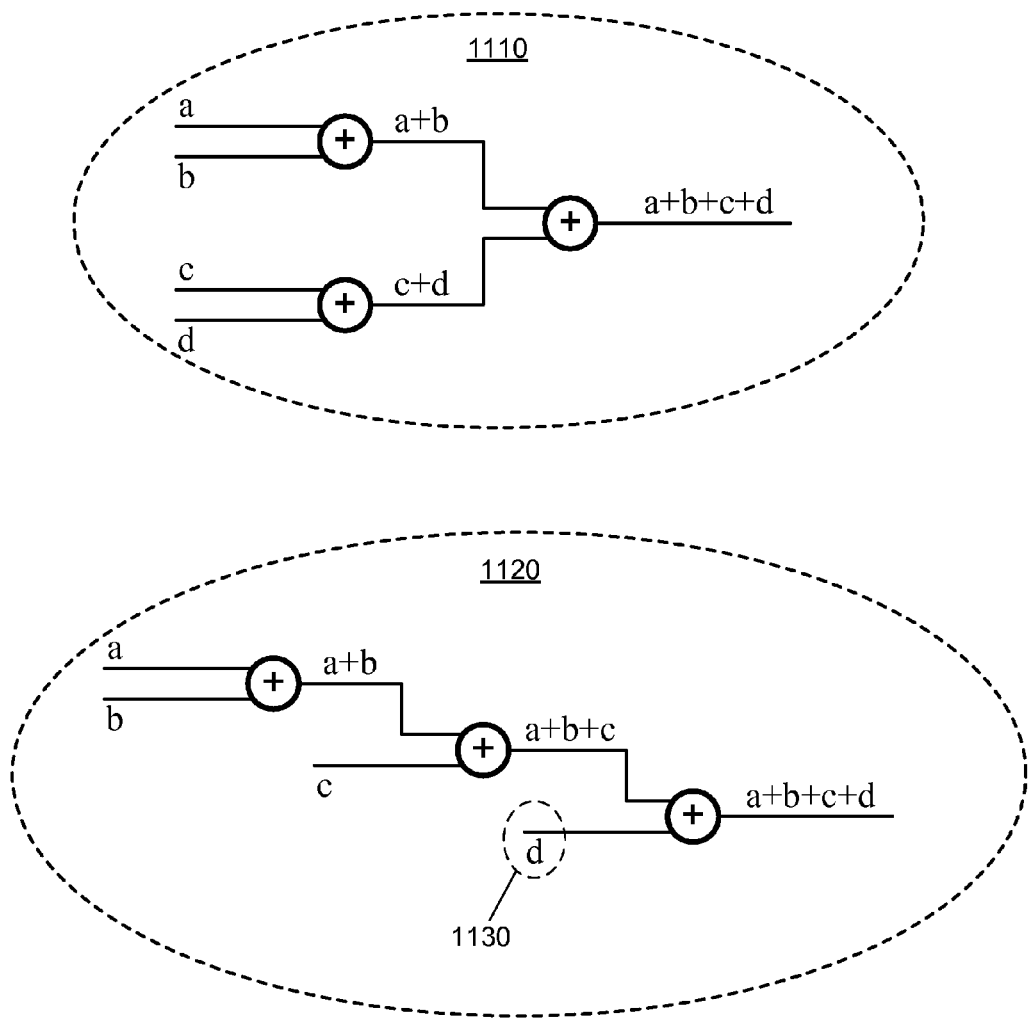
FIG. 11 illustrates balanced and unbalanced trees of some embodiments for implementing a four-input addition function.

Another data path re-ordering operation includes the formation of expression trees. Specifically, the formation of balanced and unbalanced expression trees. FIG. 11 illustrates two of the permutations of the addition operation of FIG. 10 in order to illustrate a balanced expression tree formulation 1110 and an unbalanced expression tree formulation 1120. The balanced expression tree formulation 1110 assumes that there are no late arriving signals. However, when one or more of the inputs is a late arriving signal 1130, then the unbalanced expression tree 1120 is preferred in order to implement the addition operation of FIG. 10. Since selecting between the various balanced and unbalanced expressions cannot be accomplished without knowing the predicted arrival times for each of the inputs, a decision module may be inserted to retain several viable balanced and unbalanced tree expressions until such information is later available within the design process.

2. Resource Sharing

As mentioned above, data path optimization operations of the process 900 include resource sharing operations. A resource sharing operation looks for operators (e.g., circuits) in RTL that include sharable signals. One example of a shareable resource is a multiplexer. To find shareable resources, the process 900 traverses the netlist to look for elements that are possibly shareable (e.g., multiplexers). Each time it finds such an element, it looks at the inputs and output(s) to determine whether they are of a shareable type. If so, the process calls a function that generates a functional equivalent version of that piece of the netlist by pushing the element one step backward in the signal flow.

Figure 12:
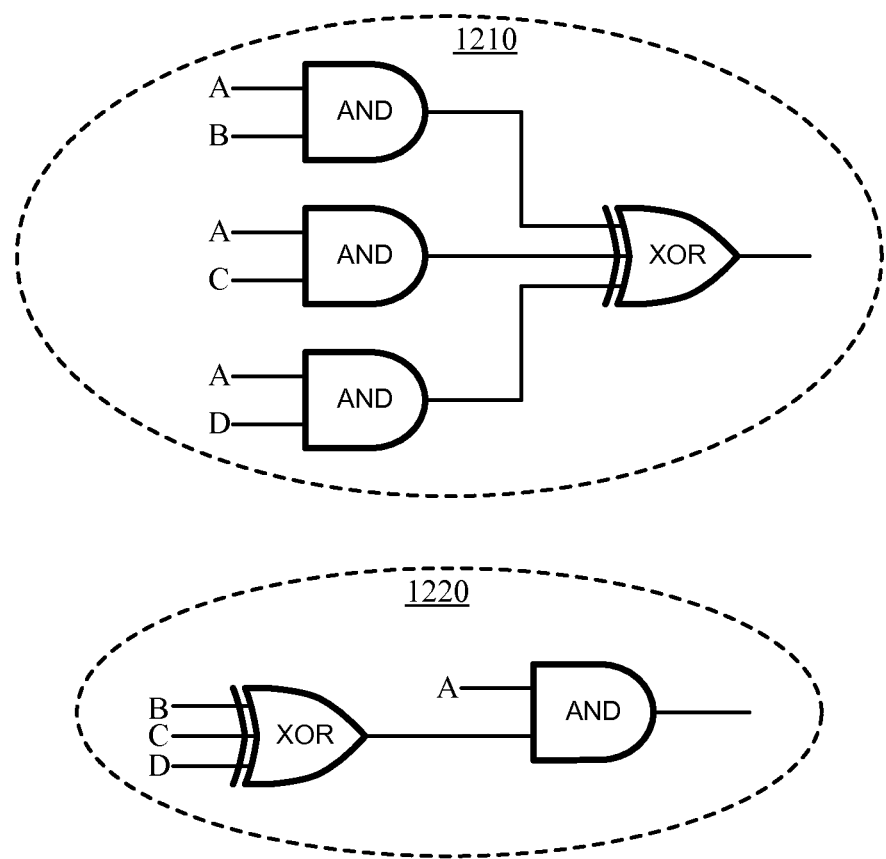
FIG. 12 illustrates an example of resource sharing in some embodiments whereby pushing an XOR gate backward reduces the total number of circuits needed to realize a particular function.

FIG. 12 illustrates an example of resource sharing whereby pushing an XOR gate backward reduces the total number of circuits needed to realize a particular function. Specifically, the circuit modules for function 1210 perform a Boolean AND between inputs A and B, A and C, and A and D and then performs a Boolean XOR on the results. The circuit modules for function 1220 produce the same result using two fewer AND gates by simply pushing the XOR gate backward so that an XOR operation is first performed on inputs B, C, and D before the results are ANDed with input A.

Given that the process 900 might not have sufficient data at a particular stage of the synthesis flow to know whether the original RTL operation or the revised version (i.e., the version with the multiplexer pushed backward or forward) is the preferred implementation, the process 900 might then use a decision cell to maintain both versions in the design until constraint data is received to determine the preferred implementation.

Figure 13:
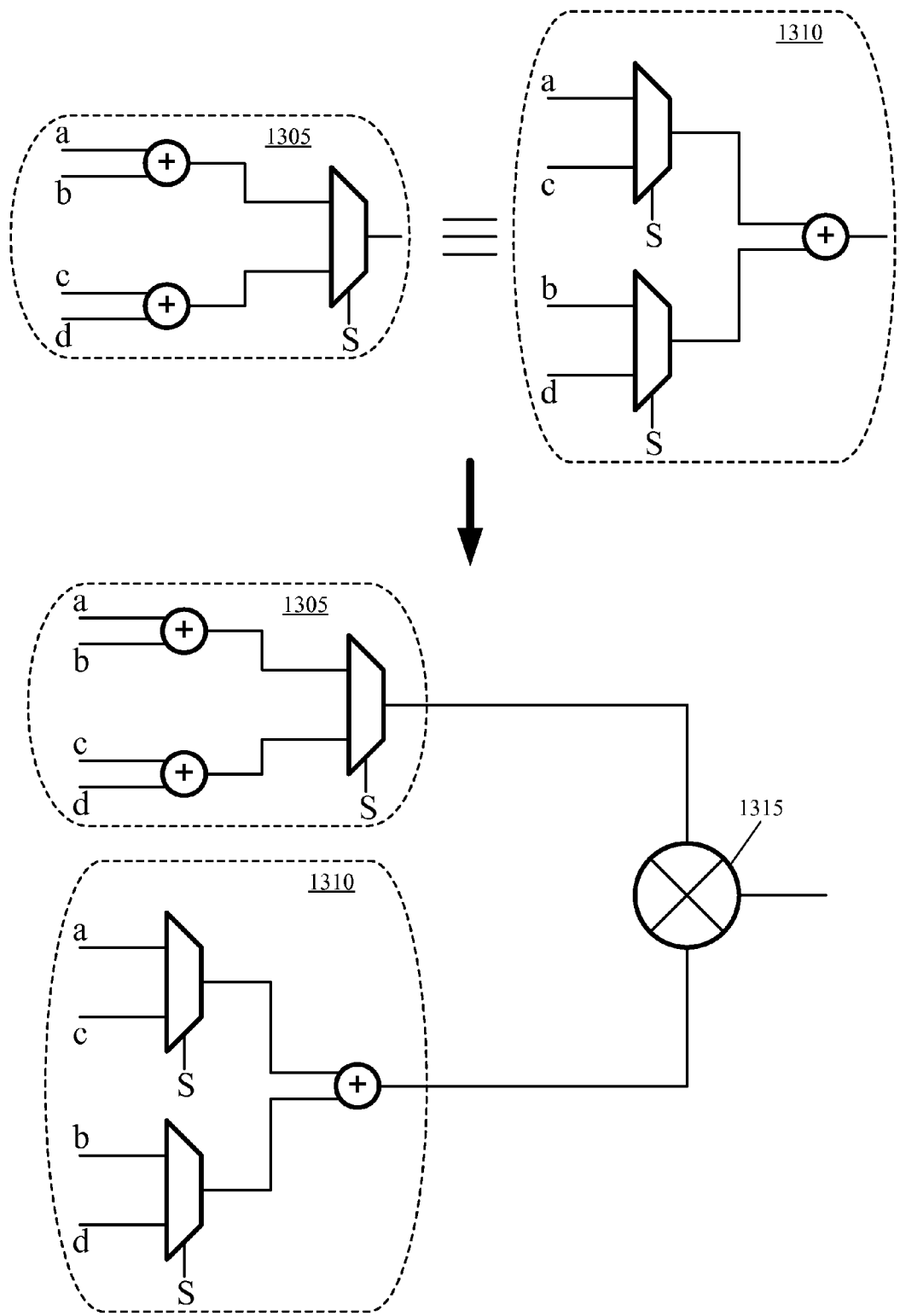
FIG. 13 illustrates an example of a circuit that either outputs the addition of "a" and "b" or the addition of "c" and "d" based on a select signal S.

FIG. 13 illustrates another example of such a resource sharing operation. Specifically, it illustrates an example of a circuit 1305 that, based on a select signal S, either outputs the addition of "a" and "b" or the addition of "c" and "d". A functionally equivalent implementation 1310 of this circuit would be using two multiplexers to select respectively between "a" or "c" and "b" or "d", and then adding the output of the two multiplexers. One of these implementations might be preferred over another implementation when costs are computed for the implementations according to one or more criteria (such as the area used by multiplexers and adders, the delay through multiplexers and adders, the signal delay, etc.). Also, one criterion might completely dictate the selection of the implementations. For instance, if the select signal S arrives considerably later than the other signals a, b, c, and d, then the first implementation 1305 becomes the only viable choice.

During the early stages of synthesis, the process 900 might not have enough information to make a selection between the two implementations. Hence, as shown in FIG. 13, some embodiments insert a decision module 1315 in the design in place of the circuit 1305 to express both implementations of the operation that outputs either the addition of "a" and "b" or the addition of "c" and "d" based on the value of a select signal (i.e., to express both implementations of the function F=S?((a+b):(c+d)).

3. Operator Realization

In most technologies, there are several ways to construct an operator. Each such operator logically performing the same operation will have different behavioral characteristics depending on its construction. Hence, some embodiments do not select a particular implementation for an operator until constraints for these behavioral characteristics are determined An adder is one such operator with several distinct implementations, each implementation having different behavioral characteristics.

A ripple carry adder, a carry look-ahead adder, a carry skip adder, or a carry save adder are viable implementation options for an adder. As mentioned above, each such adder implements the addition operation using different circuit elements. The combination of circuit elements used to construct the adder specifies different timing behavior characteristics, area characteristics, loading characteristics, etc.

Figure 14:
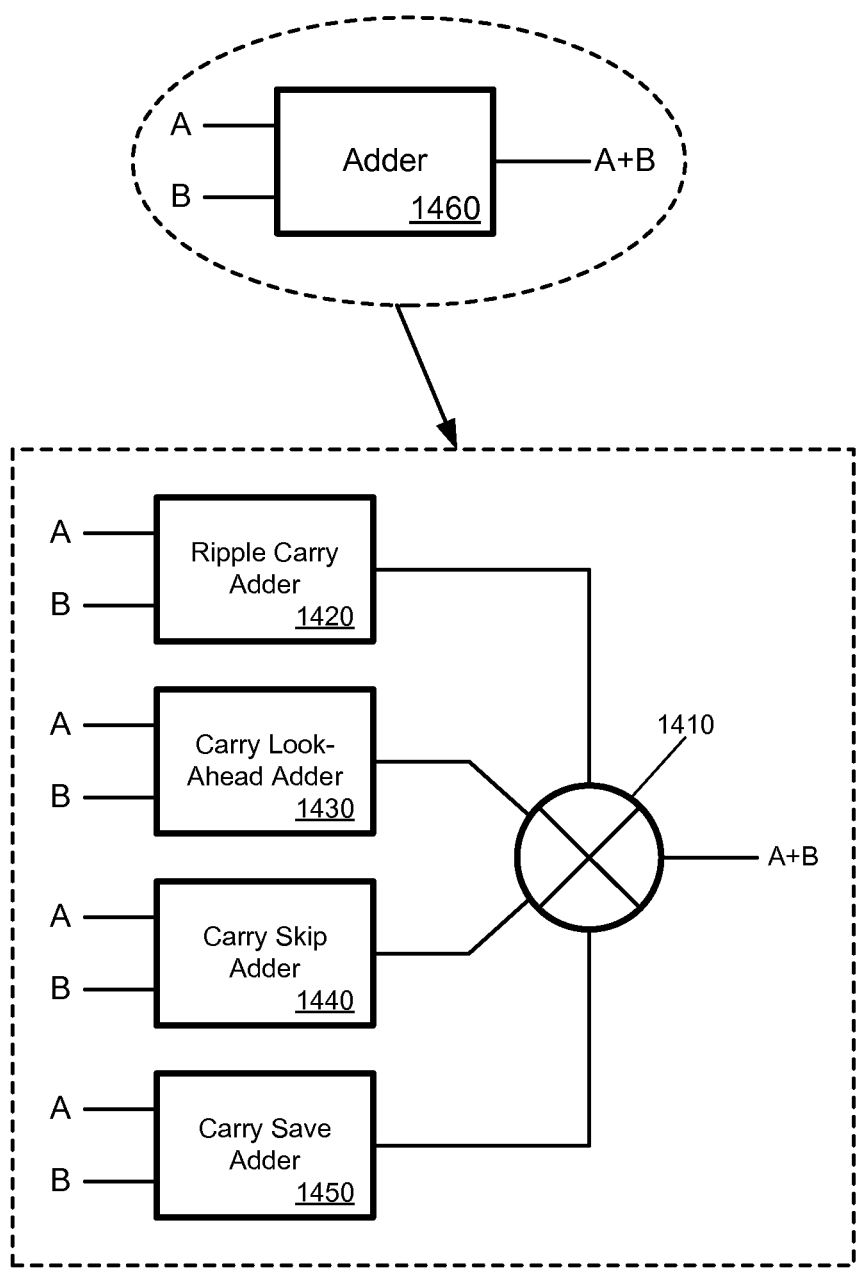
FIG. 14 illustrates an example of using a decision module of some embodiments to delay selecting an implementation for a particular operator.

In some embodiments, selecting the preferred adder implementation is delayed until the necessary constraint information is received. Hence, as shown in FIG. 14, some embodiments insert a decision module 1410 in the design along with each of the viable options 1420-1450 specifying different adder implementations for the adder 1460 specified in the user design. The decision module 1410 selects pick, which in some instances is based on initially available constraint information to preserve a complete netlist definition, a default selection, etc. However, once the necessary information for selecting the preferred adder is known, the pick of the decision module 1410 is changed to select the preferred adder that satisfies the constraints of the design.

4. Memory Mapping

The decision modules of some embodiments further assist in mapping memory logically allocated within a user design to actual memory present on physical hardware. Typically, in creating a high level design, the designer is not restricted in the number of different memories that can be specified for the design, nor is the designer restricted in specifying the sizes for each of the memories so long as total memory specified by all logical memories within the design satisfies a memory constraint variable that specifies the total available physical memory for a particular IC.

During the design process, the logically enumerated blocks of memory are mapped to corresponding physical memories of a particular IC. In some embodiments, the particular IC to which the design is mapped includes a small set of large memory blocks and/or large sets of smaller memory blocks. Each of the large physical memory blocks provides the storage functionality for one or more of the logical blocks of memory specified within the user design. Alternatively, each of the smaller physical memory blocks may be linked together to satisfy the storage functionality for a large logical memory block of the design. Specifically, the depth and width of each physical memory may differ where the depth represents the number of data bits and the width represents the number of address bits. For instance, a first 2×64 memory specifies 4 memory locations (i.e., addresses) each with 64 bits of data for 256 total bits of memory. A second 3×32 memory specifies 8 memory locations (i.e., addresses) each with 32 bits of data also for 256 total bits of memory.

The decision of whether to allocate a logical memory specified within the design to a large physical memory or several smaller memories often cannot be made without knowing the other memory requirements of other circuits of the design. Therefore, some embodiments utilize decision modules to retain multiple memory mapping options until additional constraint information identifies a preferred solution from amongst the multiple memory mapping options.

Figure 15:
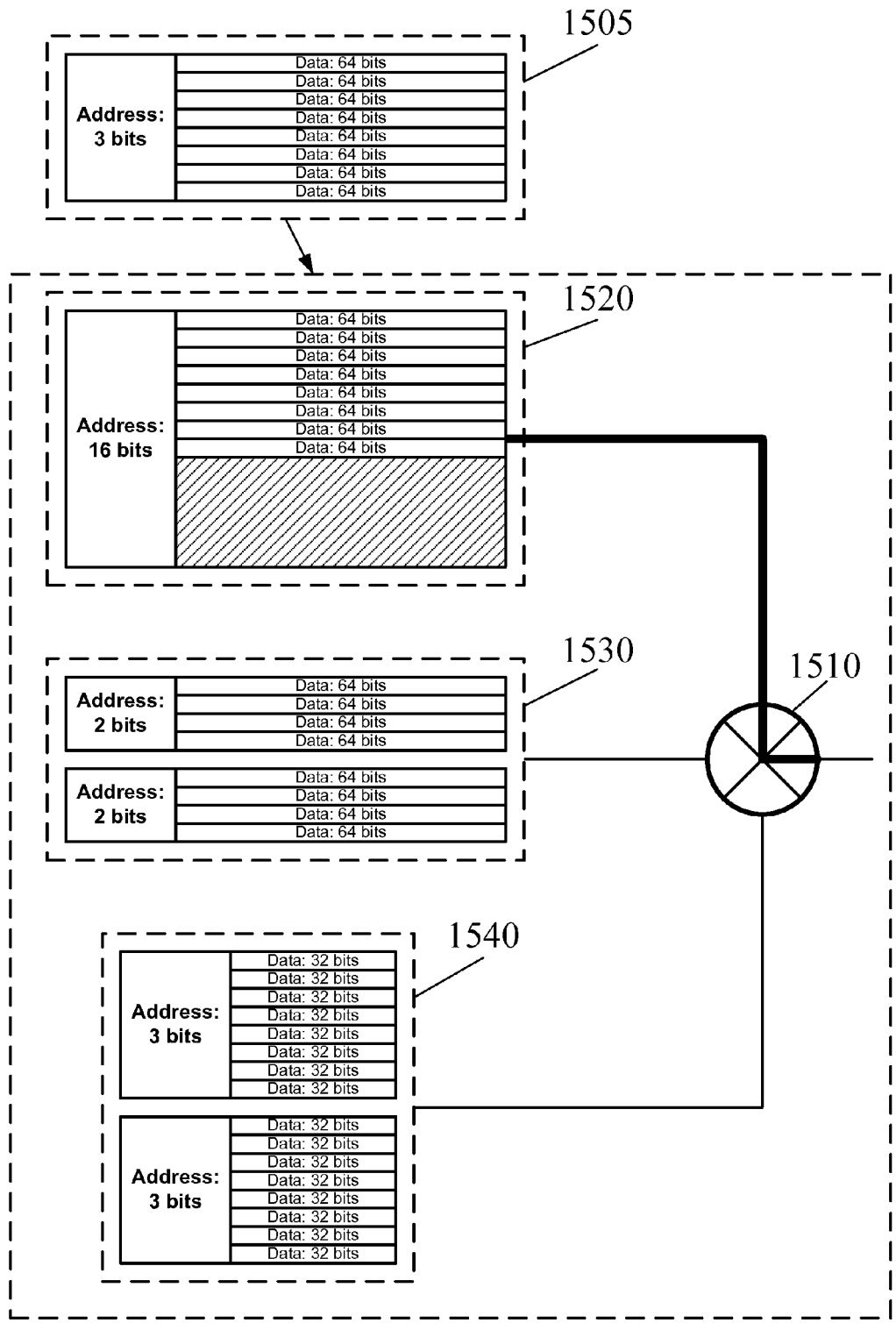
FIG. 15 conceptually illustrates using a decision module of some embodiments to retain multiple memory mapping options.

FIG. 15 conceptually illustrates using a decision module 1510 to retain multiple memory mapping options 1520-1540. In this figure, a logical memory 1505 within the user design requires 8 separate memory locations each with 64 bits of data. A first memory mapping option 1520 is to simply allocate 8 memory locations of 64 bits of data from a large 16×64 memory block. A second memory mapping option 1530 combines two separate 2×64 physical memories to satisfy the memory requirements specified by the logical memory. A third memory mapping option 1540 combines two separate 3×32 physical memories to satisfy the memory requirements specified by the logical memory.

Based on available constraint information at the time the decision module is inserted into the netlist, the first memory mapping option 1520 is selected as the pick of decision module 1510. However, additional constraint information that is determined later in the synthesis flow may specify a different allocation for the physical memory by selecting the second 1530 or third 1540 memory mapping options as the pick for decision module 1510.

In some embodiments, the decision modules also assist in minimizing or eliminating simultaneous memory accesses to the same physical memory during memory mapping. If several simultaneously accessed memory blocks of the user design are mapped to the same physical memory, then it is likely that the physical memory may have insufficient read/write data lines available to fulfill each of the memory requests. In such instances, timing of the IC is detrimentally affected.

Additionally, the alignment of the interface to some memories is a constraining factor even when timing is satisfied. For example, a particular memory driven by pads located at a particular side of the memory may provide a more preferred routing (e.g., less wiring, better timing) than a memory driven by pads located at the opposite side. However, memory access information and physical implementation information may not be available early in the design process. As such, preferred memory mapping may be best determined at later stages of the design process.

Figure 16:
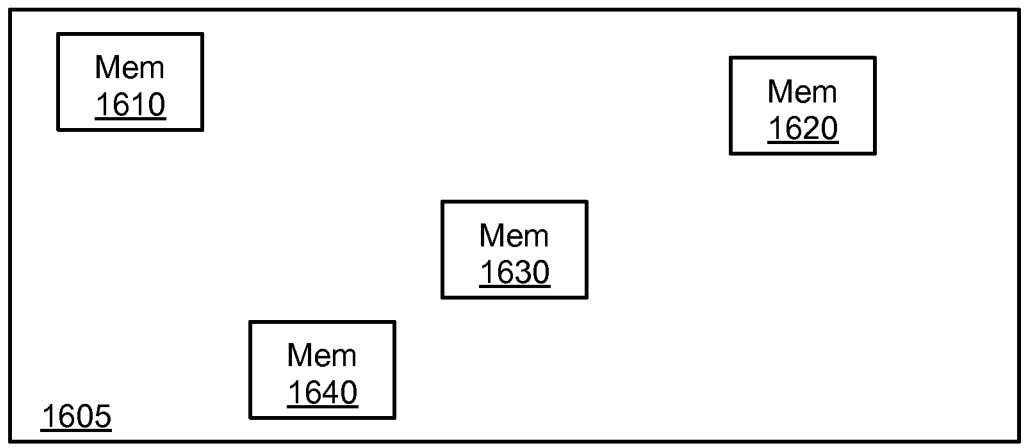
FIG. 16 illustrates a user design that specifies four separate blocks of memory interspersed throughout the design that must be mapped to two physical memories and of an IC.
Figure 16:
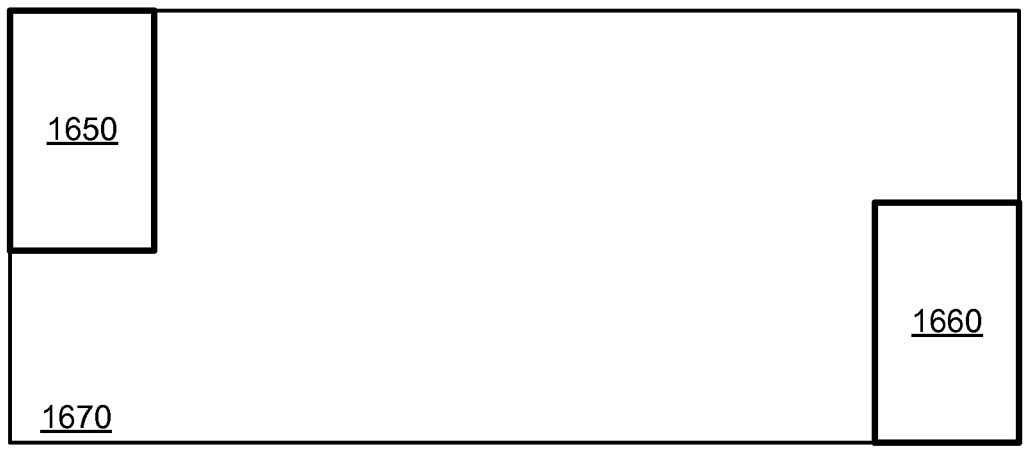
Figure 17:
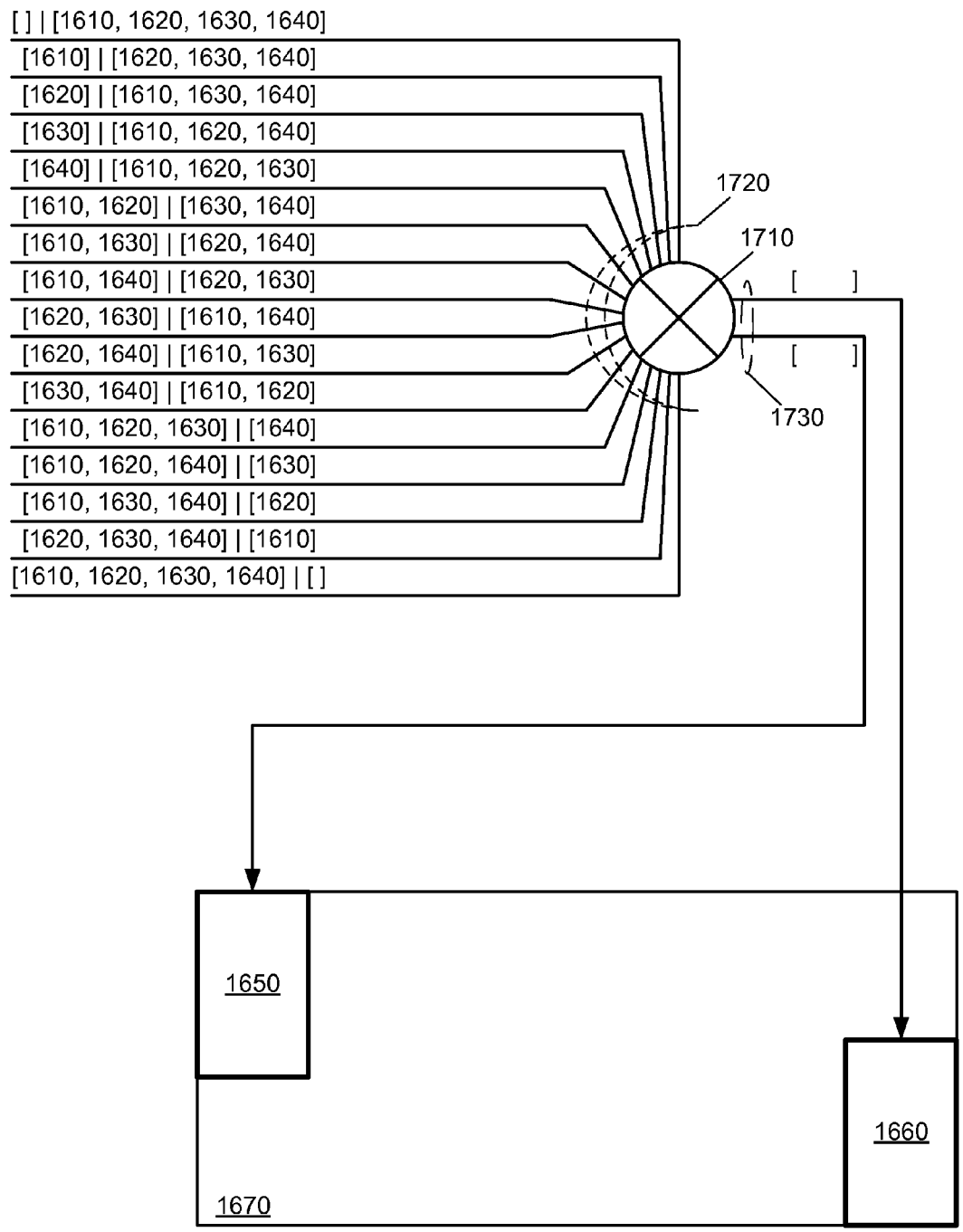
FIG. 17 illustrates the use of a decision module of some embodiments to delay the memory mapping operation until the timing information for the memory blocks of FIG. 16 is known.
Figure 18:
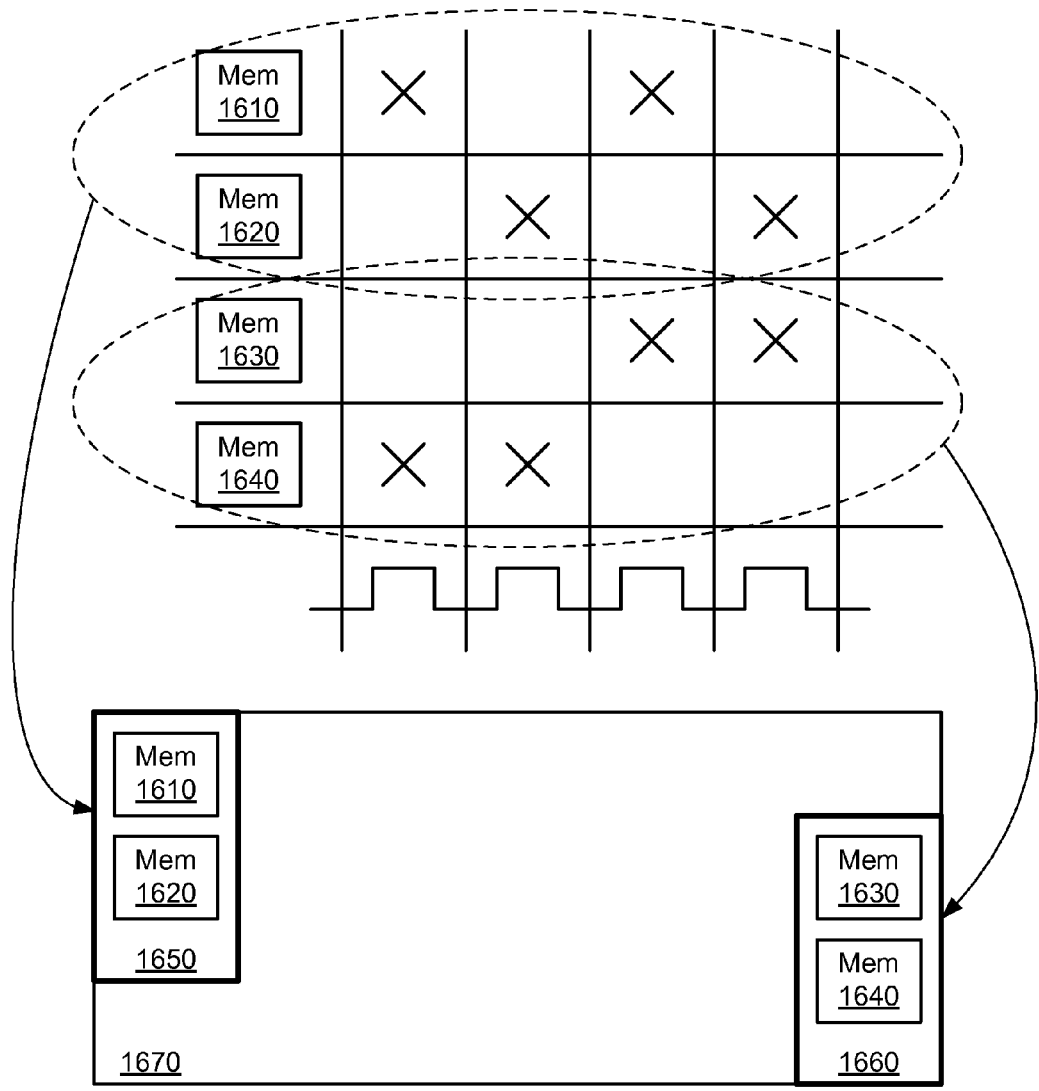
FIG. 18 presents the preferred mapping for the user design memory blocks of FIG. 16 to the physical hardware memories as determined by the timing information for the user design memory blocks.

To delay memory mapping, some embodiments employ decision modules to retain viable mapping options until the necessary constraint information becomes available. FIGS. 16-18 illustrate a preferred memory mapping using decision modules to delay the memory mapping operation until timing information for a particular user design is known. In FIG. 16, a user design 1605 logically specifies four separate blocks of memory 1610, 1620, 1630, and 1640 interspersed throughout the design 1605. The user design 1605 is to be mapped to the particular IC 1670 with two large physical memories 1650 and 1660.

FIG. 17 illustrates the use of a decision module to delay the memory mapping operation until the timing information for the memory blocks 1610-1640 is known. The inputs 1720 to the decision module 1710 receive and retain each viable mapping solution for the design enumerated memories 1610-1640. The outputs 1730 from the decision module 1710 specify a particular memory mapping to the physical memories 1650 and 1660 of the IC 1670. The decision module 1710 is one example of a decision module with multiple outputs.

FIG. 18 presents a preferred mapping for the user design memory blocks 1610-1640 to the physical hardware memories 1650 and 1660 as determined by the timing information for the user design memory blocks 1610-1640. In FIG. 18, the timing information identifies that for every four clock cycles, memory 1610 is accessed on the first and third cycles, memory 1620 is accessed on the second and fourth cycles, memory 1630 is accessed on the third and fourth cycles, and memory 1640 is accessed on the first and second cycles.

By grouping user design memory blocks 1610 and 1620 to a first physical memory 1650 and user design memory blocks 1630 and 1640 to a second physical memory 1660, the IC avoids simultaneous accesses to either physical memory block 1650 or 1660 during operation of the IC 1670. In this manner, some embodiments need only perform one memory mapping iteration to determine the preferred memory mapping shown for the IC 1670. Without the decision modules retaining the viable options until the timing information is known, the mapping for the memory modules would blindly occur and any mapping except for the preferred mapping shown in FIG. 18 would result in memory access faults from simultaneous accesses to the physical memories 1650 and 1660.

5. SAT Sweeping & Logic Restructuring

As part of the synthesis flow, some embodiments perform a SAT sweeping process to identify redundant points within the netlist. As particular redundancies are identified, they are merged together to simplify the netlist. The removal of redundancies through the SAT sweeping process may affect the number of viable solutions for a decision module since the identified redundancies may identify two or more of the viable options for the decision module. Therefore, if redundancies are merged, it is possible that the number of viable solutions for a particular decision module will also decrease.

Figure 19:
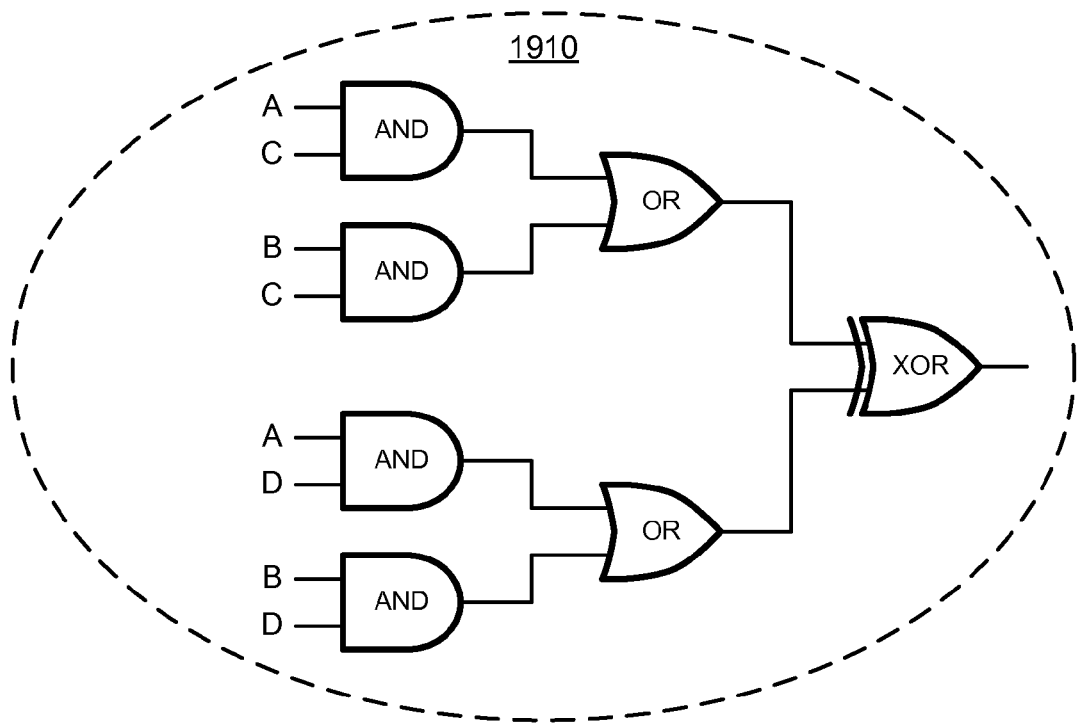
FIG. 19 illustrates an example of logic restructuring that produces a structurally different implementation for an existing Boolean function in accordance with some embodiments.
Figure 19:
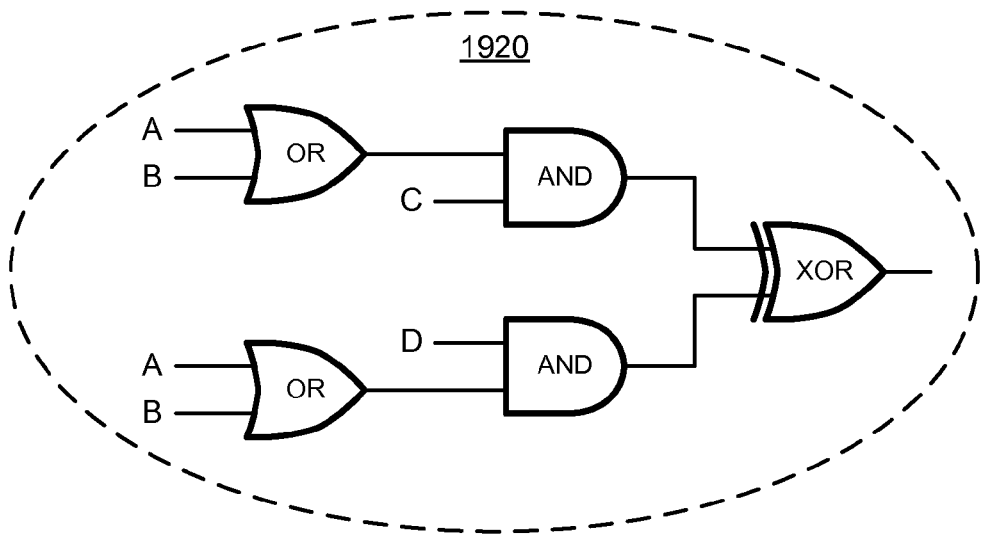

While SAT sweeping removes redundancies from the netlist that are already present within the netlist, the process of logic restructuring produces new realizations not previously within the netlist. FIG. 19 illustrates an example of logic restructuring that produces a structurally different implementation for an existing Boolean function in accordance with some embodiments. The function 1910 performs the same Boolean function as that of function 1920, however each of the functions 1910 and 1920 are structurally different.

For instance, function 1910 includes four AND gates, two OR gates, and one XOR gate whereas function 1920 includes two AND gates, two OR gates, and one XOR gate. Since function 1920 performs the Boolean function using fewer logic gates than function 1910, some embodiments produce function 1920 as a new realization of function 1910. In some embodiments, the structure of function 1920 may already be present within the design. Therefore, some embodiments avoid introducing the redundant circuit structure for function 1910 by reusing the existing function 1920 already within the design.

6. Technology Mapping

In some embodiments, the back-end operations specify using the available Boolean logic of a particular technology to perform the non-Boolean logic operations received from the front-end. Technology mapping specifies the process for converting the non-Boolean logic to Boolean logic. Specifically, technology mapping involves transforming the circuit modules of the user design to the corresponding circuit elements of a particular circuit fabric. This transformation introduces certain constraint data particular to the selected technology.

Therefore, during technology mapping, the alternative implementations at the inputs to the various decision modules may change as the non-Boolean implementations are converted to their corresponding Boolean implementations. As such, the pick carried over for a decision module from the non-Boolean implementation may no longer satisfy constraints imposed after the Boolean conversions operations are complete. Using this additional constraint information, some embodiments are able to prune the set of alternatives and select a viable solution than the current pick.

IV. Physical Design

After the various synthesis stages described above, the EDA process produces the physical design. The physical design includes the placement of user design circuit modules at physical locations within an integrated circuit. Additionally, the physical design includes routing of the various interconnects to establish the interdependencies and communication pathways between the physical circuit modules.

In some embodiments, these post-synthesis operations are conducted by a placement engine and a routing engine. In some embodiments, the routing engine is part of the placement engine while in other embodiments, the routing engine works in conjunction and/or concurrently with the placement engine.

The physical design produced by the placement and routing engines realizes overall timing, congestion, and other constraints for the user design. For instance, the various circuit modules used to construct a portion of a netlist during technology mapping may become distributed to different regions of the IC during placement. The overall timing of the logical netlist or the portion of the netlist is thus disrupted in the physical design. As a result, timing for the netlist or a portion of the chip may fail. One such example includes an initial placement of circuit modules that results in one or more paths that exceed clock cycle or sub-cycle time allocations.

Typically, these circuit modules or sections of the IC are flagged and returned to the synthesis tools. The constraint data pertaining to these circuit modules or sections is also returned to the synthesis tools. The synthesis tools then determine an alternative implementation for the flagged circuit modules that satisfies the identified constraints before returning back to the placement and routing engines to reproduce the physical design.

Due to the limited visibility of the synthesis tools, such an approach does not always lead to acceptable convergence. While resolving for a particular constraint within a particular flagged area, the synthesis tools may disrupt other constraints imposed on other circuit modules at different sections of the design, thus causing the process to repeat. As a result, numerous back and forth iterations between the synthesis tools and the placement and routing engines are often needed to satisfy all synthesis, physical design, and other design constraints.

Some embodiments leverage the functionality provided by the decision modules to facilitate these post-synthesis operations. Specifically, some embodiments utilize decision modules to facilitate the placement and routing operations for the physical design by avoiding the continual passing of information between the synthesis and the post-synthesis stages of the EDA process. Instead, by retaining multiple different solutions using the decision cell, the placement and routing engines are able to select alternative solutions in order to resolve the placement or routing issue without having to revert back to an earlier synthesis or post-synthesis stage of operation.

Figure 20:
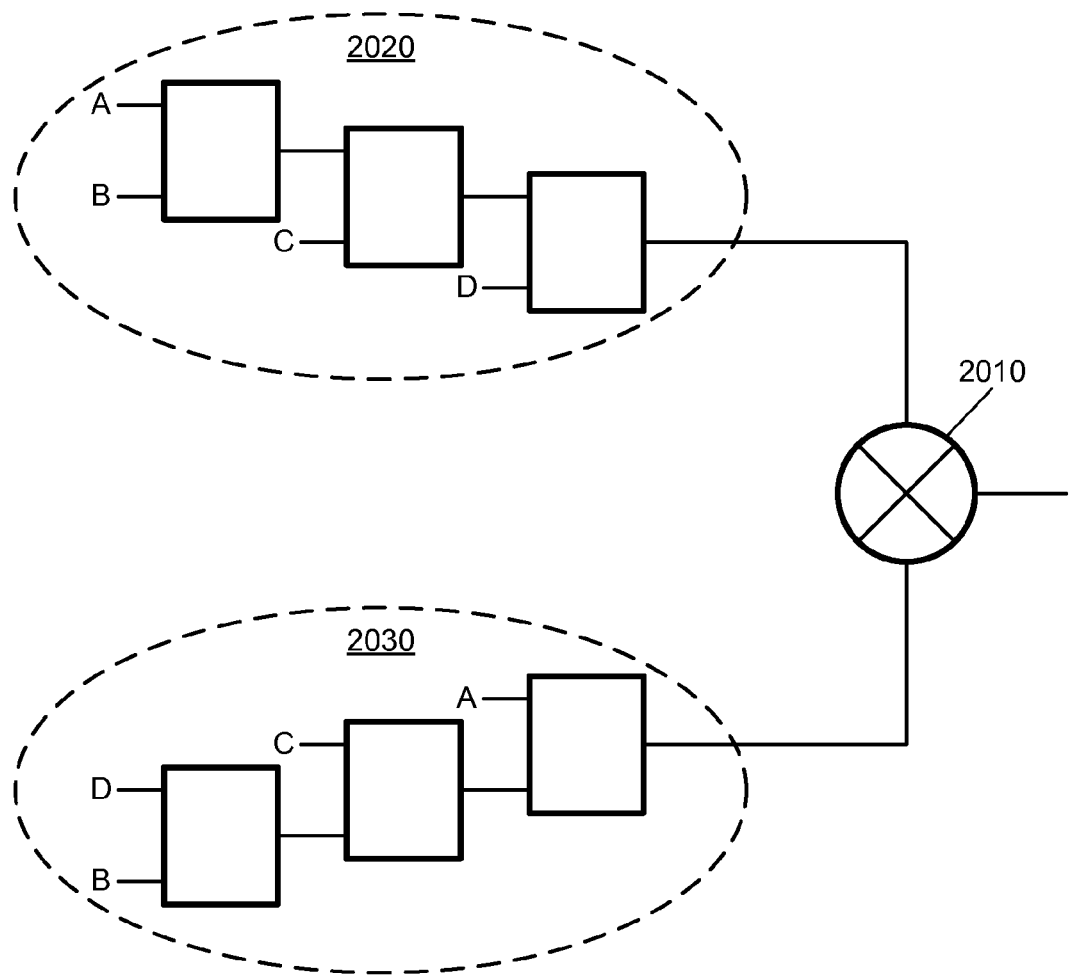
FIG. 20 illustrates a decision cell of some embodiments with multiple alternative implementations for a given portion of a netlist to facilitate placement of a user design.

FIG. 20 illustrates a decision cell 2010 with multiple synthesis solutions 2020 and 2030 for a given portion of a netlist used to facilitate placement of a user design. In this figure, the decision cell 2010 includes two alternatives 2020 and 2030. Each alternative 2020 and 2030 specifies a different implementation for a portion of a netlist. Therefore, should a first placement solution fail to meet placement constraints, the placement engine of some embodiments selects a second implementation from the decision cell 2010 to attempt to resolve the placement constraints. The placement engine thus avoids re-synthesizing a netlist when a placement solution does not meet placement constraints. As a result, placement is completed faster using fewer processing resources.

Figure 21:
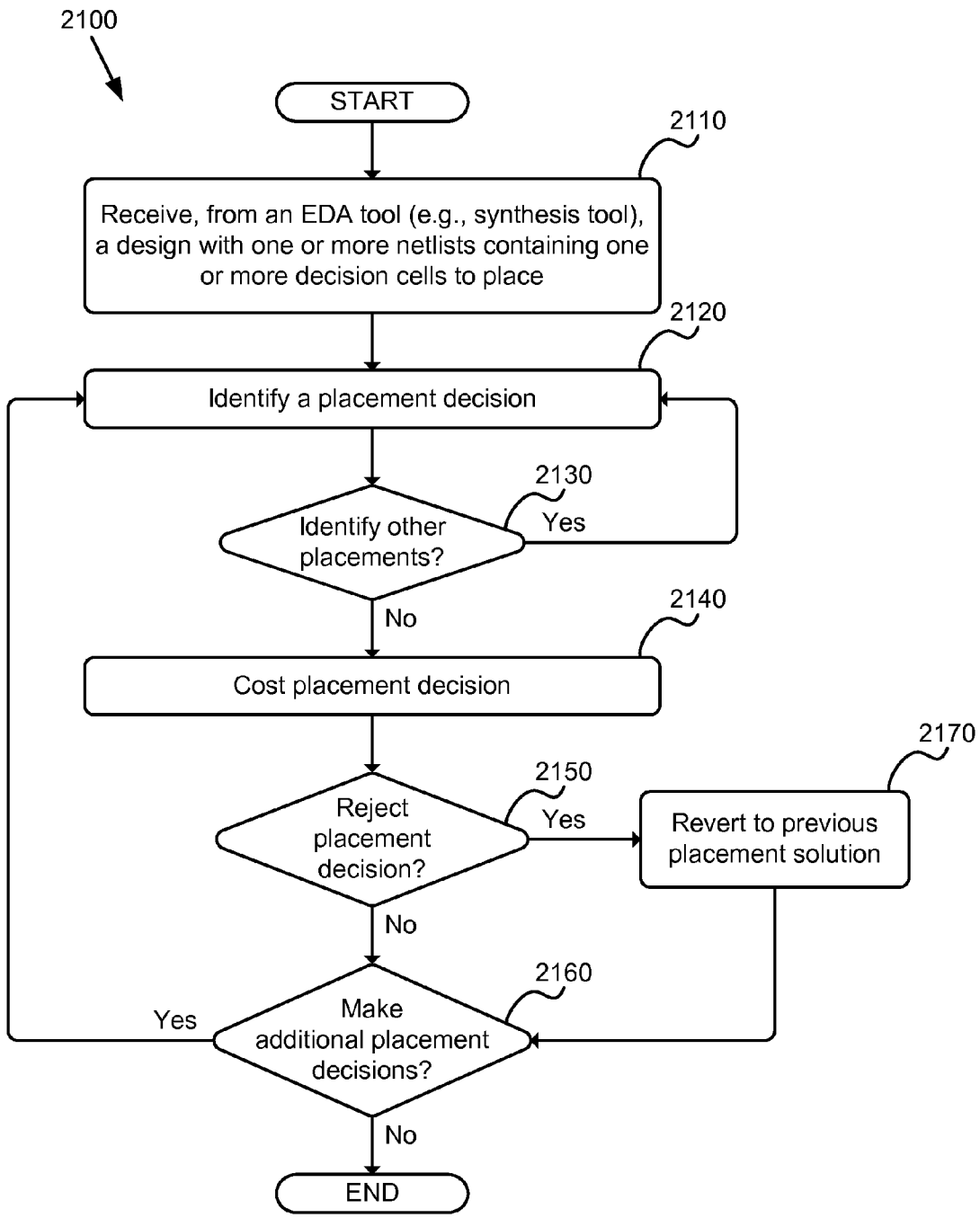
FIG. 21 presents a process that utilizes the decision cells of some embodiments to facilitate placement.

FIG. 21 presents a process 2100 that utilizes the decision cells of some embodiments to facilitate placement. The process 2100 begins by receiving (at 2110) an IC design specified by one or more netlists that include one or more decision cells from an EDA tool (e.g., a synthesis tool). The process then identifies (at 2120) a placement decision. In some embodiments, a placement decision is identified when: (1) a new location is specified for an element of the netlist that is not a decision cell, (2) a new selection of an alternative decision solution that has to be placed is made, or (3) a new location is specified for circuit modules of a previously placed decision cell solution.

It should be apparent to one of ordinary skill in the art that other factors may also cause a placement engine to identify a placement decision. For instance, a change to a circuit module of an unrelated first netlist that interferes with an already placed selection of a decision cell of a second netlist may cause a placement decision to be identified.

Similarly, after identifying (at 2120) the placement decision, the process determines (at 2130) if other placements for other previously placed circuit modules have to be modified based on the identified placement decision. If so, the process identifies (at 2120) the additional placement decisions. After determining (at 2130) that all placement decisions have been identified, the process costs (at 2140) the placement decision(s) to determine whether to accept (at 2150) the placement decision initially identified at 2120. The process accepts the placement decision when the placement decision satisfies one or more placement constraints (e.g., congestion goals) or if it is determined that the placement decision is more optimal than a previously selected placement decision (based on the cost). The cost of a placement decision may be determined, in some embodiments, based on a variety of factors such as circuit area, signal delay, etc. For instance, even though a first placement decision satisfies a placement constraint, a second placement decision may do so by occupying fewer physical resources and is thus more optimal.

When the process accepts (at 2150) the placement decision, then the process determines (at 2160) whether to make additional placement decisions. When the process rejects (at 2150) the placement decision, the process then reverts (at 2170) back to a previous placement solution and determines (at 2160) whether to make additional placement decisions. When the process determines (at 2160) that additional placement decisions need to be made, then the process reverts to operation 2120. Otherwise, the process terminates.

It should be apparent to one of ordinary skill in the art that the process 2100 is one possible implementation for performing placement using decision cells in accordance with some embodiments. In other embodiments, the process might be implemented differently. For instance, the process 2100 of some embodiments may allow for more than one decision cell solution to be fractionally selected at any given time so long as at the end of the placement iteration, only one solution for each decision cell is selected. Specifically, some embodiments formulate the placement problem in terms of a linear programming problem that allows for different decision cell solutions to be afforded different selection rates or different fractional placement costs. Some such embodiments allow the use of a linear programming solver to ultimately solve the placement problem to identify a placement that has one solution selected and placed for each decision cell.

Figure 22:
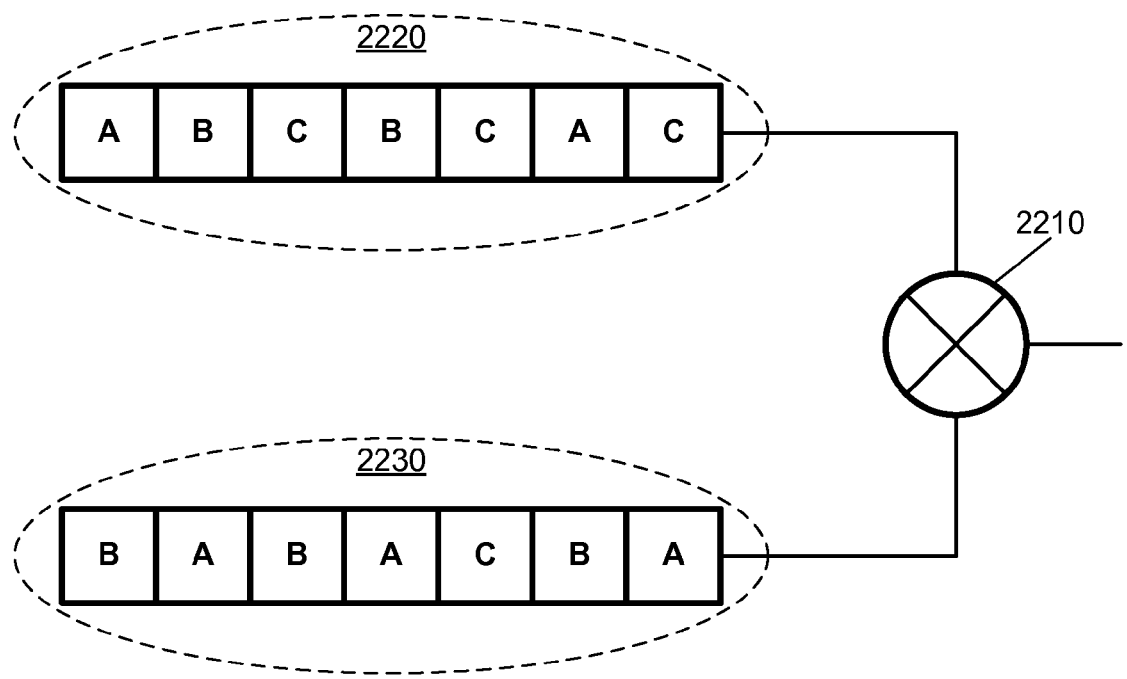
FIG. 22 illustrates a decision cell with multiple alternative placements for a given netlist.

In conjunction with or instead of using decision cells to facilitate placement, some embodiments utilize decision cells to facilitate routing of the IC design. FIG. 22 illustrates a decision cell 2210 with multiple alternative placements 2220 and 2230 for a given netlist. In this figure, the decision cell 2210 includes two alternative placements 2220 and 2230. Each alternative 2220 and 2230 specifies a different placement solution. Therefore, should a first placement alternative fail to meet routing constraints (e.g., timing constraints), the routing engine of some embodiments selects a second placement alternative from the decision cell 2210 to attempt to resolve the routing constraints. Thus, the routing engine need not revert back to synthesis or placement in order to evaluate different alternative placements. As a result, routing is completed faster using fewer processing resources.

Figure 23:
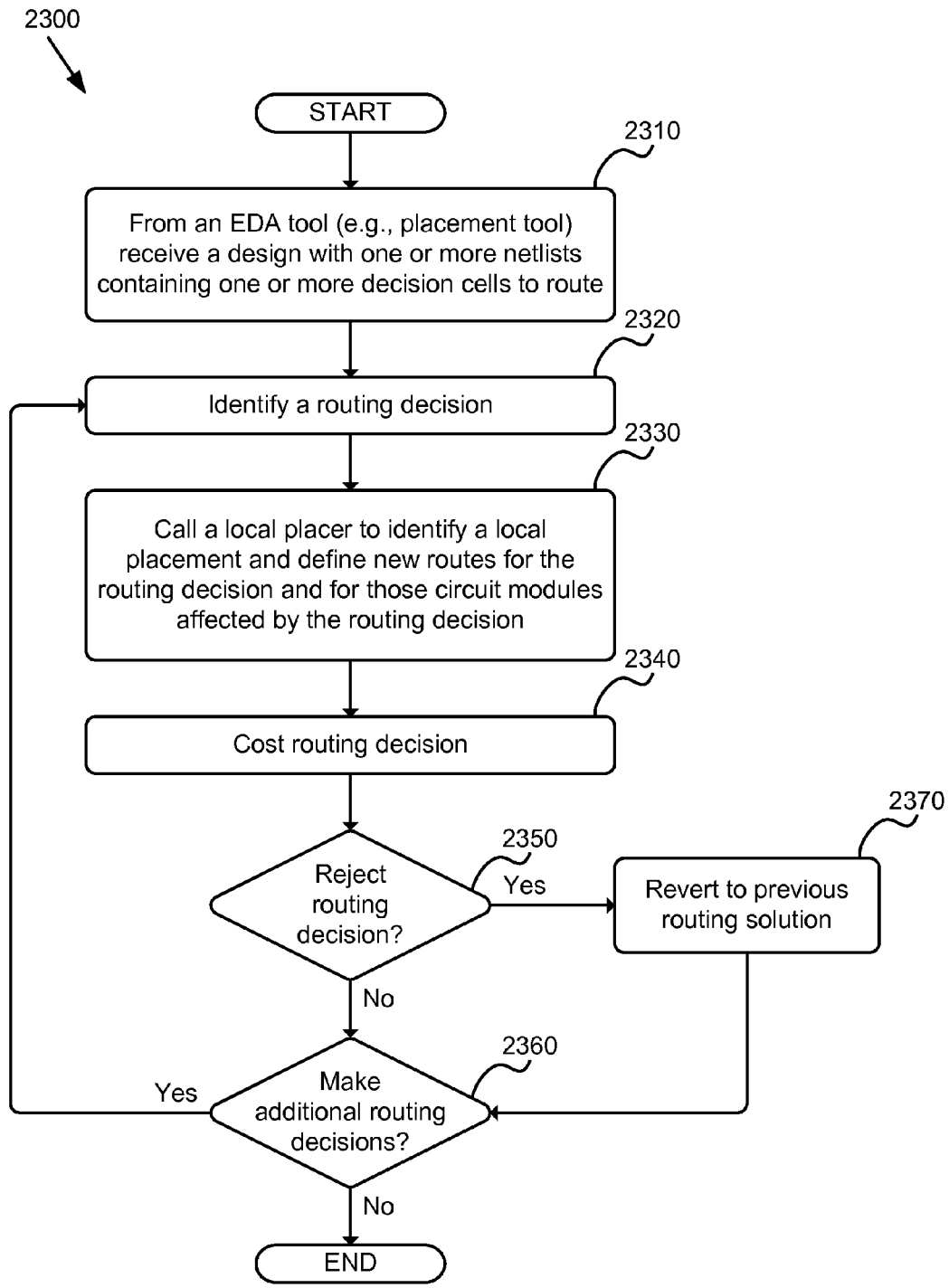
FIG. 23 presents a process that utilizes the decision cells of some embodiments to facilitate routing.

FIG. 23 presents a process 2300 that utilizes the decision cells of some embodiments to facilitate routing. The process 2300 begins by receiving (at 2310) an IC design specified by one or more netlists containing one or more decision cells from an EDA tool (e.g., a placement tool). The process then identifies (at 2320) a routing decision. In some embodiments, a routing decision is identified when: (1) connecting circuit modules after placement, (2) a new decision cell solution is selected that needs to be routed, and/or (3) a previously routed circuit module is modified.

After identifying (at 2320) the routing decision, the process calls (at 2330) a local placer to identify a local placement and define new routes for the routing decision and for those circuit modules affected by the routing decision. The process costs (at 2340) the routing decision to determine (at 2350) whether to accept the placement decision. The process accepts (at 2350) the routing decision when the routing decision satisfies one or more routing constraints (e.g., timing constraints) or if it is determined that the routing decision is more optimal than a previously selected routing decision (based on the cost). The cost of a routing decision may be determined, in some embodiments, based on a variety of factors such as circuit area, signal delay, etc. For instance, even though a first routing decision satisfies a routing constraint, a second routing decision may do so with less wiring congestion and is thus more optimal.

If the process accepts (at 2350) the routing decision, then the process determines (at 2360) whether to continue iterating to make alternative routing decisions. If the process does not accept (at 2350) the routing decision, the process then reverts (at 2370) back to a previous routing solution and determines (at 2360) whether to continue iterating to make alternative routing decisions. If the process determines (at 2360) that there are additional routing decisions, then the process reverts back to operation 2320. Otherwise, the process terminates.

By utilizing the decision cells within the post-synthesis stages, the necessary information to resolve the physical design constraints is already within the possession of the post-synthesis placement and routing engines. These engines only need to prune the solutions that do not satisfy the identified constraints in order to arrive at a solution that is functionally equivalent and a solution that satisfies the set of constraints. Since the decision modules of some embodiments combinatorially represent an exponential number of alternatives in a linear space, the overhead associated with passing such information between the different operations (e.g., between the synthesis and post-synthesis or between placement and routing) of the EDA design process is minimal Moreover, since the decision modules are abstract primitives, the decision modules may be retained throughout the design process even though the representation for the design itself changes. By pruning ineffective alternative solutions at every stage where constraint information becomes available, the preferred solution is reached through a linear progression of operations.

While the invention has been described with reference to numerous specific details, one of ordinary skill in the art will recognize that the invention can be embodied in other specific forms without departing from the spirit of the invention. For instance, in some embodiments, decision modules are used to facilitate the implementation of various other electronic circuits besides ICs. Some such electronic circuits include field programmable grid arrays (FPGA) that include configurable circuits where after identifying a preferred solution to a particular section of the netlist, the implementation includes defining configuration data to configure the circuits of the FPGA to perform the selected preferred implementation.

V. Manufacturing Flow

Figure 24:
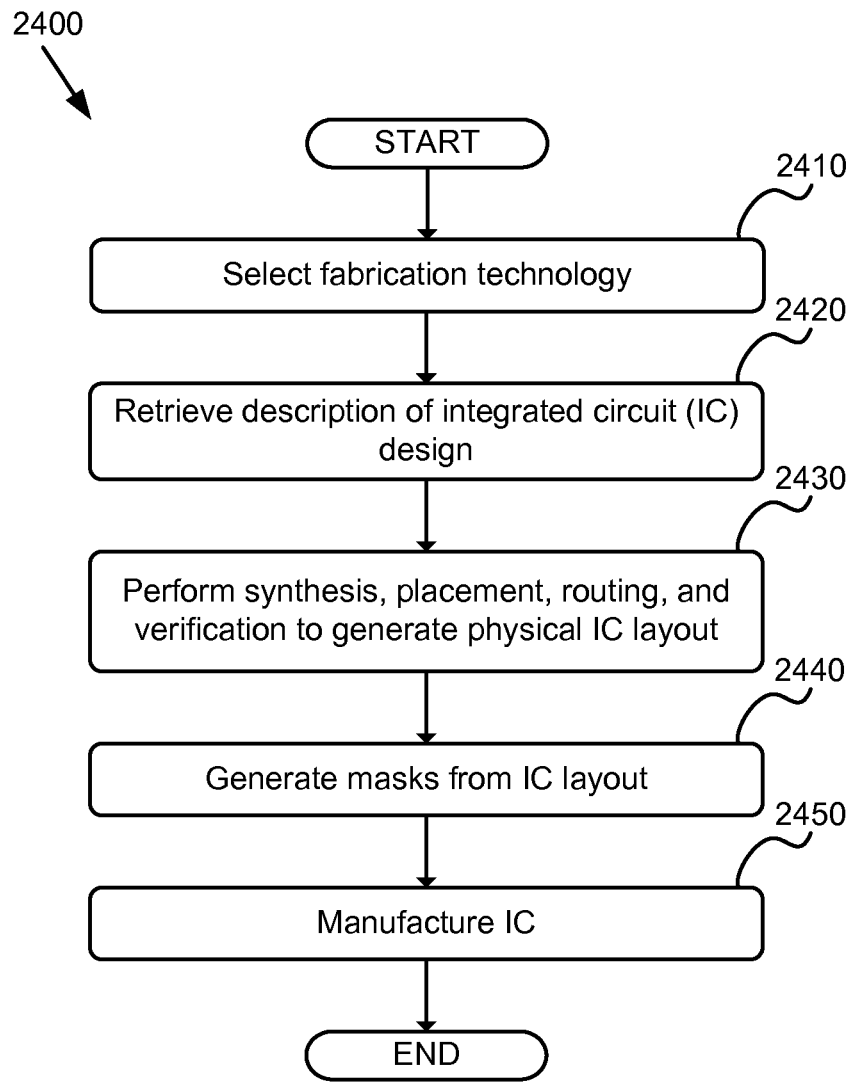
FIG. 24 conceptually illustrates the overall process used with some embodiments to manufacture an IC.

FIG. 24 conceptually illustrates the overall process used with some embodiments to manufacture an IC. The process 2400 begins at 2410 when a fabrication technology is selected. Next, the process retrieves (at 2420) a description of the IC design (e.g., an HDL description). After retrieving the description of the IC, the process performs (at 2430) synthesis, placement, routing, and verification of the description retrieved at 2420. The synthesis, placement, and routing operations were described above in Sections III-IV. The verification operation may include design rule checking, layout versus schematic checking, electrical rule checks, etc.

After generating (at 2430) the physical IC layout, the process generates (at 2440) masks based on the physical IC layout. Finally, the masks are used to manufacture (at 2450) the IC. In some cases, the IC may receive further processing, such as packaging, final test, quality control testing, etc.

One of ordinary skill will recognize that the process 2400 is a conceptual representation of the operations used to used to manufacture an IC. The specific operations of the process may not be performed in the exact order described. In addition, different specific operations may be performed in different embodiments. Also, the process may not be performed as one continuous series of operations. Furthermore, the process could be implemented using several sub-processes, or as part of a larger macro-process.

VI. Computer System

Many of the above-described processes and modules are implemented as software processes that are specified as a set of instructions recorded on a computer readable storage medium (also referred to as "computer readable medium" or "machine readable medium"). When these instructions are executed by one or more computational element(s) (such as processors or other computational elements like application-specific ICs (ASIC) and FPGAs), they cause the computational element(s) to perform the actions indicated in the instructions. Computer is meant in its broadest sense, and can include any electronic device with a processor. Examples of computer readable media include, but are not limited to, CD-ROMs, flash drives, RAM chips, hard drives, EPROMs, etc.

In this specification, the term "software" is meant in its broadest sense. It can include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs when installed to operate on one or more computer systems define one or more specific machine implementations that execute and perform the operations of the software programs.

Figure 25:
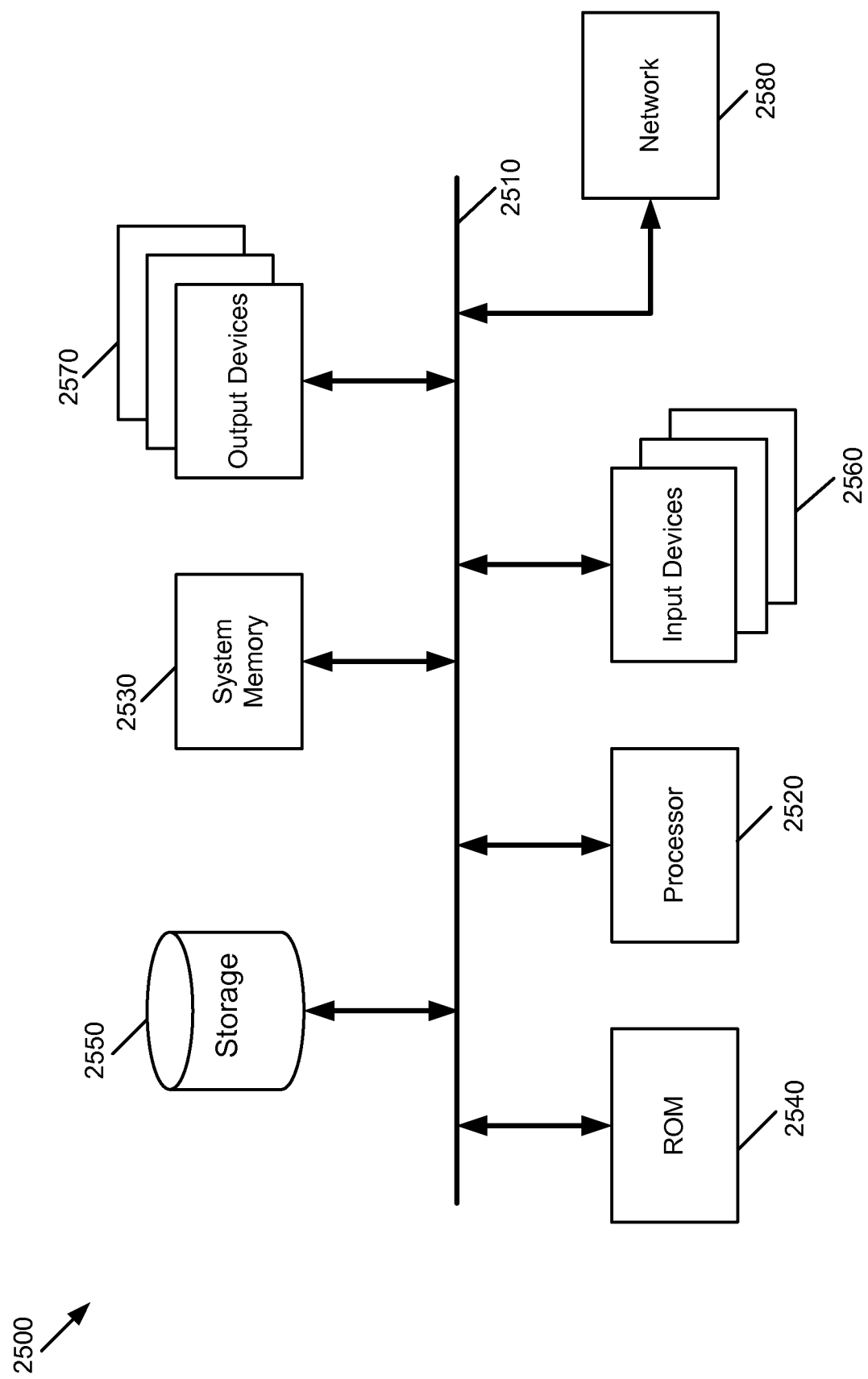
FIG. 25 illustrates a computer system with which some embodiments of the invention are implemented.

FIG. 25 illustrates a computer system 2500 with which some embodiments of the invention are implemented. For example, the processes described in reference to FIGS. 8, 9, 21, and 23 may be at least partially implemented using sets of instructions that are run on the computer system 2500. Such a computer system includes various types of computer readable mediums and interfaces for various other types of computer readable mediums. Computer system 2500 includes a bus 2510, a processor 2520, a system memory 2530, a read-only memory (ROM) 2540, a permanent storage device 2550, input devices 2560, output devices 2570, and a network connection 2580.

One of ordinary skill in the art will recognize that the computer system 2500 may be embodied in other specific forms without deviating from the spirit of the invention. For instance, the computer system may be implemented using various specific devices either alone or in combination. For example, a local PC may include the input devices 2560 and output devices 2570, while a remote PC may include the other devices 2510-2550, with the local PC connected to the remote PC through a network that the local PC accesses through its network connection 2580 (where the remote PC is also connected to the network through a network connection).

The bus 2510 collectively represents all system, peripheral, and chipset buses that communicatively connect the numerous internal devices of the computer system 2500. In some cases, the bus 2510 may include wireless and/or optical communication pathways in addition to or in place of wired connections. For example, the input devices 2560 and/or output devices 2570 may be coupled to the system 2500 using a wireless local area network (W-LAN) connection, Bluetooth®, or some other wireless connection protocol or system.

The bus 2510 communicatively connects the processor 2520 with the system memory 2530, the ROM 2540, and the permanent storage device 2550. From these various memory units, the processor 2520 retrieves instructions to execute and data to process in order to execute the processes of the invention. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The ROM 2540 stores static data and instructions that are needed by the processor 2520 and other modules of the computer system. The permanent storage device 2550, on the other hand, is a read-and-write memory device. This device is a non-volatile memory unit that stores instructions and data even when the computer system 2500 is off. Some embodiments of the invention use a mass-storage device (such as a magnetic or optical disk and its corresponding disk drive) as the permanent storage device 2550.

Other embodiments use a removable storage device (such as a floppy disk, flash drive, or CD-ROM) as the permanent storage device. Like the permanent storage device 2550, the system memory 2530 is a read-and-write memory device. However, unlike storage device 2550, the system memory 2530 is a volatile read-and-write memory, such as a random access memory (RAM). The system memory stores some of the instructions and data that the processor needs at runtime. In some embodiments, the sets of instructions used to implement the invention's processes are stored in the system memory 2530, the permanent storage device 2550, and/or the read-only memory 2540.

The bus 2510 also connects to the input devices 2560 and output devices 2570. The input devices 2560 enable the user to communicate information and select commands to the computer system. The input devices include alphanumeric keyboards and pointing devices (also called "cursor control devices"). The input devices also include audio input devices (e.g., microphones, MIDI musical instruments, etc.) and video input devices (e.g., video cameras, still cameras, optical scanning devices, etc.). The output devices 2570 include printers, electronic display devices that display still or moving images, and electronic audio devices that play audio generated by the computer system. For instance, these display devices may display a GUI. The display devices include devices such as cathode ray tubes ("CRT"), liquid crystal displays ("LCD"), plasma display panels ("PDP"), surface-conduction electron-emitter displays (alternatively referred to as a "surface electron display" or "SED"), etc. The audio devices include a PC's sound card and speakers, a speaker on a cellular phone, a Bluetooth® earpiece, etc. Some or all of these output devices may be wirelessly or optically connected to the computer system.

Finally, as shown in FIG. 25, bus 2510 also couples computer 2500 to a network 2580 through a network adapter (not shown). In this manner, the computer can be a part of a network of computers (such as a local area network ("LAN"), a wide area network ("WAN"), an Intranet, or a network of networks, such as the Internet. For example, the computer 2500 may be coupled to a web server (network 2580) so that a web browser executing on the computer 2500 can interact with the web server as a user interacts with a GUI that operates in the web browser.

As mentioned above, the computer system 2500 may include one or more of a variety of different computer-readable media (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ZIP® disks, read-only and recordable blu-ray discs, ultra density optical discs, any other optical or magnetic media, and floppy disks. The computer-readable media may store a computer program that is executable by at least one processor and includes sets of instructions for performing various operations.

For the purposes of this Specification, a computer is a machine and the terms display or displaying mean displaying on an electronic device. It should be recognized by one of ordinary skill in the art that any or all of the components of computer system 2500 may be used in conjunction with the invention. Moreover, one of ordinary skill in the art will appreciate that any other system configuration may also be used in conjunction with the invention or components of the invention.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claim:

1. A method comprising:
receiving an abstract circuit representation of an integrated circuit (IC) design comprising a plurality of segments, each segment for implementing a particular function;
for a particular segment of the IC design:
identifying, at a computer, a plurality of alternative implementations for the particular segment; and
defining a decision module for inclusion in the IC design during a plurality of stages of a multi-stage design process, said decision module comprising (i) a plurality of inputs, each input connected to one of the plurality of alternative implementations for the particular segment of the IC design, and (ii) an output for selecting a particular alternative implementation from the plurality of inputs to include as part of the IC design; and
using said decision module to design the IC.

2. The method of claim 1, wherein during at least one stage of the multi-stage design process, the particular alternative implementation connected to a particular input to the decision module is modified based on design constraints realized during said stage.

3. The method of claim 1, wherein during at least one stage of the multi-stage design process, the output of the decision module is modified by selecting a different input based on design constraints realized during said stage.

4. The method of claim 1, wherein during the plurality of stages, a non-Boolean representation of the IC design is transformed to a Boolean representation, wherein said decision module is included within the non-Boolean and Boolean representations of the IC design.

5. The method of claim 4, wherein the non-Boolean representation comprises a register transfer language (RTL) representation for the functionality of the IC design and the Boolean representation comprises a circuit level representation for the functionality of the IC design.

6. The method of claim 1, wherein the plurality of stages comprise synthesis and post-synthesis stages.

7. The method of claim 6, wherein the post-synthesis stages include at least one of placement and routing.

8. A method of transforming a representation of an integrated circuit (IC) design, the method comprising:
receiving a first representation of the IC design comprising a plurality of segments, wherein a particular segment comprises (i) a plurality of alternative implementations, each alternative implementation for performing functionality of the particular segment, and (ii) a decision module for making a selection of an alternative implementation from among the plurality of alternative implementations; and
performing, at a computer, a plurality of transformations on the first representation to produce a second representation of the IC design, said performing comprising:
for the particular segment, examining at least two of the alternative implementations during the plurality of transformations to determine which of the alternative implementations should be selected for the second representation, wherein said transformations comprise non-Boolean transformations.

9. The method of claim 8, wherein the plurality of transformations further comprise Boolean transformations.

10. The method of claim 9, wherein the non-Boolean transformations comprise at least one of memory mapping operations and operator realization operations and the Boolean transformations comprise at least one of logic restructuring operations and technology mapping operations.

11. The method of claim 8, wherein the second representation is an output produced from synthesis of the IC design, wherein said decision module is retained within the IC design throughout synthesis.

12. The method of claim 8, wherein the decision module comprises (i) a plurality of inputs, each input for receiving one or more outputs of a particular alternative implementation for the particular segment, and (ii) at least one output for selecting one of the inputs to supply to at least one other segment within the IC design that receives, as an input, an output of the particular segment.

13. The method of claim 12, wherein performing the plurality of transformations comprises performing at least two distinct synthesis operations, wherein after at least one synthesis operation, an alternative implementation is eliminated as an input to the decision module based on design constraints.

14. The method of claim 13, wherein eliminating an alternative implementation comprises (i) computing a metric score for each alternative implementation as determined by the design constraints and (ii) eliminating an alternative implementation based on the metric score.

15. The method of claim 8, wherein performing the plurality of transformations comprises performing at least two distinct synthesis operations, wherein after at least one of the synthesis operations, the selection of an alternative implementation made by the decision module is modified based on design constraints.

16. The method of claim 8 further comprising defining a physical design for the second representation, wherein a physical design for the particular segment comprises using an implementation of the decision module that best satisfies placement constraints.

17. The method of claim 8 further comprising defining a physical design for the second representation, wherein a physical design for the particular segment comprises using an implementation of the decision module that best satisfies routing constraints.

18. The method of claim 8, wherein performing the plurality of transformations comprises performing resource sharing during a synthesis operation.

19. The method of claim 8, wherein performing the plurality of transformations comprises performing Boolean satisfiability (SAT) sweeping during a synthesis operation.

20. The method of claim 8, wherein each of the alternative implementations are functionally equivalent but structurally different.

21. A method of defining a physical design for an integrated circuit (IC) design, the method comprising:
receiving, at a computer, a netlist for defining a function of the IC design, said netlist comprising at least one decision module for representing a plurality of alternative implementations for said function; and
selecting, at the computer, a particular alternative implementation from the plurality of alternative implementations represented by the decision module that best satisfies physical design constraints.

22. The method of claim 21, wherein said netlist comprises a plurality of circuit modules for performing said function, wherein said decision module represents a plurality of alternative circuit module implementations for performing said function.

23. The method of claim 22, wherein each of the alternative circuit module implementations comprises a different structural arrangement of circuit elements.

24. The method of claim 21, wherein selecting the particular alternative implementation comprises performing placement for at least one of the alternative implementations to determine whether the alternative implementation satisfies placement constraints.

25. The method of claim 21, wherein selecting the particular alternative implementation comprises performing routing for at least one of the alternative implementations to determine whether the alternative implementation satisfies routing constraints.

26. A method of defining a physical design for an integrated circuit (IC) design, the method comprising:
inserting a decision module that retains a plurality of alternative implementations for a segment of the IC design into the IC design at a particular stage of a multi-stage design process;
during at least one subsequent stage of the multi-stage design process, examining at least two different alternative implementations retained by the decision module while performing a plurality of transformations to the IC design that identify design constraints that are employed at the subsequent stage; and
defining, at a computer, a physical design for the IC design by utilizing an implementation retained by the decision module that satisfies the identified design constraints.

27. The method of claim 26, wherein the design constraints comprise timing constraints.

28. The method of claim 26, wherein the design constraints comprise area constraints.

29. The method of claim 26, wherein the design constraints comprise delays associated with each implementation for the segment.

30. The method of claim 26, wherein the multi-stage design process comprises synthesis and post-synthesis operations.

* * * * *